United States Patent
Vytla et al.

(10) Patent No.: US 10,224,918 B2
(45) Date of Patent: Mar. 5, 2019

(54) ACTIVE GATE BIAS DRIVER

(71) Applicant: Infineon Technologies Americas Corp., El Segundo, CA (US)

(72) Inventors: Rajeev-Krishna Vytla, El Segundo, CA (US); Danish Khatri, El Segundo, CA (US); Min Fang, Manhattan Beach, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 1 day.

(21) Appl. No.: 15/372,219

(22) Filed: Dec. 7, 2016

(65) Prior Publication Data

US 2018/0159520 A1    Jun. 7, 2018

(51) Int. Cl.
*H03K 17/18* (2006.01)
*H03K 17/16* (2006.01)
*H03K 17/06* (2006.01)

(52) U.S. Cl.
CPC ......... *H03K 17/063* (2013.01); *H03K 17/163* (2013.01); *H03K 17/166* (2013.01); *H03K 17/18* (2013.01); *H03K 2217/0036* (2013.01)

(58) Field of Classification Search
CPC .......... H03K 17/04123; H03K 17/063; H03K 17/165; H03K 17/18; H03K 2017/066; H03K 2217/0036; H03K 2217/0045; H03K 2217/0081; H03K 19/00; H03K 19/00361
USPC ........................ 327/108–112; 326/83, 86–87
See application file for complete search history.

(56) References Cited

U.S. PATENT DOCUMENTS

| 5,744,994 | A | 4/1998 | Williams |
| 5,929,690 | A | 7/1999 | Williams |
| 7,518,415 | B2 * | 4/2009 | Yen ...................... G09G 3/3688 326/87 |
| 7,852,125 | B2 | 12/2010 | Lopez et al. |
| 2017/0063223 | A1 * | 3/2017 | Raghupathy ............ H02M 3/07 |

OTHER PUBLICATIONS

Dolny, et al., "The Influence of Body Effect and Threshold Voltage Reduction on Trench MOSFET Body Diode Characteristics," Proceedings of 2004 International Symposium on Power Semiconductor Devices, May 24-27, 2004; pp. 217-220.
Elferich, et al., "Impact of Gate Voltage Bias on Reverse Recovery Losses of Power MOSFETs," Twenty-First Annual IEEE Applied Power Electronics Conference and Exposition, 2006. APEC'06, Mar. 2006 pp. 1390-1395.
Lindberg-Poulsen, et al., "Practical investigation of the gate bias effect on the reverse recovery behavior of the body diode in power MOSFETs," Proceedings of the 2014 International Power Electronics Conference; May 18-21, 2014; pp. 2842-2849.

* cited by examiner

*Primary Examiner* — Lincoln D Donovan
*Assistant Examiner* — Diana J. Cheng
(74) *Attorney, Agent, or Firm* — Shumaker & Sieffert, P.A.

(57) ABSTRACT

A device is described that includes a gate driver configured to output, to a gate of a switch, a turn-on voltage for activating the switch in response to receiving an indication to activate the switch and an active gate bias driver configured to actively drive a voltage at the gate of the switch to a bias voltage in response to receiving an indication to deactivate the switch. The bias voltage is less than the turn-on voltage and wherein the bias voltage is greater than a ground voltage of the gate driver.

16 Claims, 17 Drawing Sheets

ACTIVE GATE BIAS DRIVER

TECHNICAL FIELD

This disclosure relates to gate drivers for driving semiconductor devices.

BACKGROUND

In a switch, such as a field effect transistor (FET), a body diode provides a freewheeling capability and permits reverse recovery behavior. For example, during the turn-off interval of the switch, the body diode becomes forward biased and a reverse recovery charge accumulates in the switch. At the start of a turn-on interval of the switch, the reverse recovery charge accumulated in the switch recombines. During a switching cycle, this recombination results in a switching power loss of the switch.

SUMMARY

In general, circuits and techniques are described for actively driving a voltage at a gate of a switch such that a reverse recovery charge in a switch is reduced, thereby reducing the switching loss in that and in the complementary switch. Rather than providing a ground voltage to a gate of a switch to deactivate a switch, a gate driver may actively drive a voltage of the gate of the switch to a bias voltage. For example, the gate driver may actively drive a voltage of the gate of the switch to a bias voltage that is less than a threshold voltage during the dead time to reduce the body diode conduction of the switch. Additionally, the gate driver may actively adjust the bias voltage by tracking the temperature coefficient of the threshold voltage to avoid temperature related dynamic effects like shoot through and undesired turn-on. In this way, a reverse recovery charge in that and in complimentary switch is reduced, thereby reducing a switching loss in the switch.

In one example, the disclosure is directed to a device that includes a gate driver configured to output, to a gate of a switch, a turn-on voltage for activating the switch in response to receiving an indication to activate the switch and an active gate bias driver configured to actively drive a voltage at the gate of the switch to a bias voltage in response to receiving an indication to deactivate the switch. The bias voltage is less than the turn-on voltage and wherein the bias voltage is greater than a ground voltage of the gate driver.

In another example, the disclosure is directed to a method including outputting, to a gate of a switch, a turn-on voltage for activating the switch in response to receiving an indication to activate the switch and actively driving a voltage at the gate of the switch to a bias voltage in response to receiving an indication to deactivate the switch. The bias voltage is less than the turn-on voltage and wherein the bias voltage is greater than a ground voltage of the switch.

In another example, the disclosure is directed to a system including a gate driver and an active gate bias driver. The gate driver is configured to generate a first control signal in response to receiving an indication to activate a switch, the first control signal being configured to activate a first switching element such that the gate drive module outputs, to a gate of the switch, a turn-on voltage for activating the switch. The gate driver is further configured to generate a second control signal in response to receiving an indication to deactivate the switch, the second control signal being configured to deactivate a second switching element such that the gate drive module outputs, to the gate of the switch, a ground voltage for deactivating the switch. The active gate bias driver comprises a timing control module and an active gate bias module. The timing control module is configured to output an indication to provide an active gate bias voltage for deactivating the switch based on the first and second control signals. The active gate bias module is configured to actively drive a voltage at the gate of the switch to a bias voltage in response to receiving the indication to provide the active gate bias voltage for deactivating the switch. The bias voltage is less than the turn-on voltage and wherein the bias voltage is greater than the ground voltage for deactivating the switch.

The details of one or more examples are set forth in the accompanying drawings and the description below. Other features, objects, and advantages of the disclosure will be apparent from the description and drawings, and from the claims.

DETAILED DESCRIPTION

Figure 1:
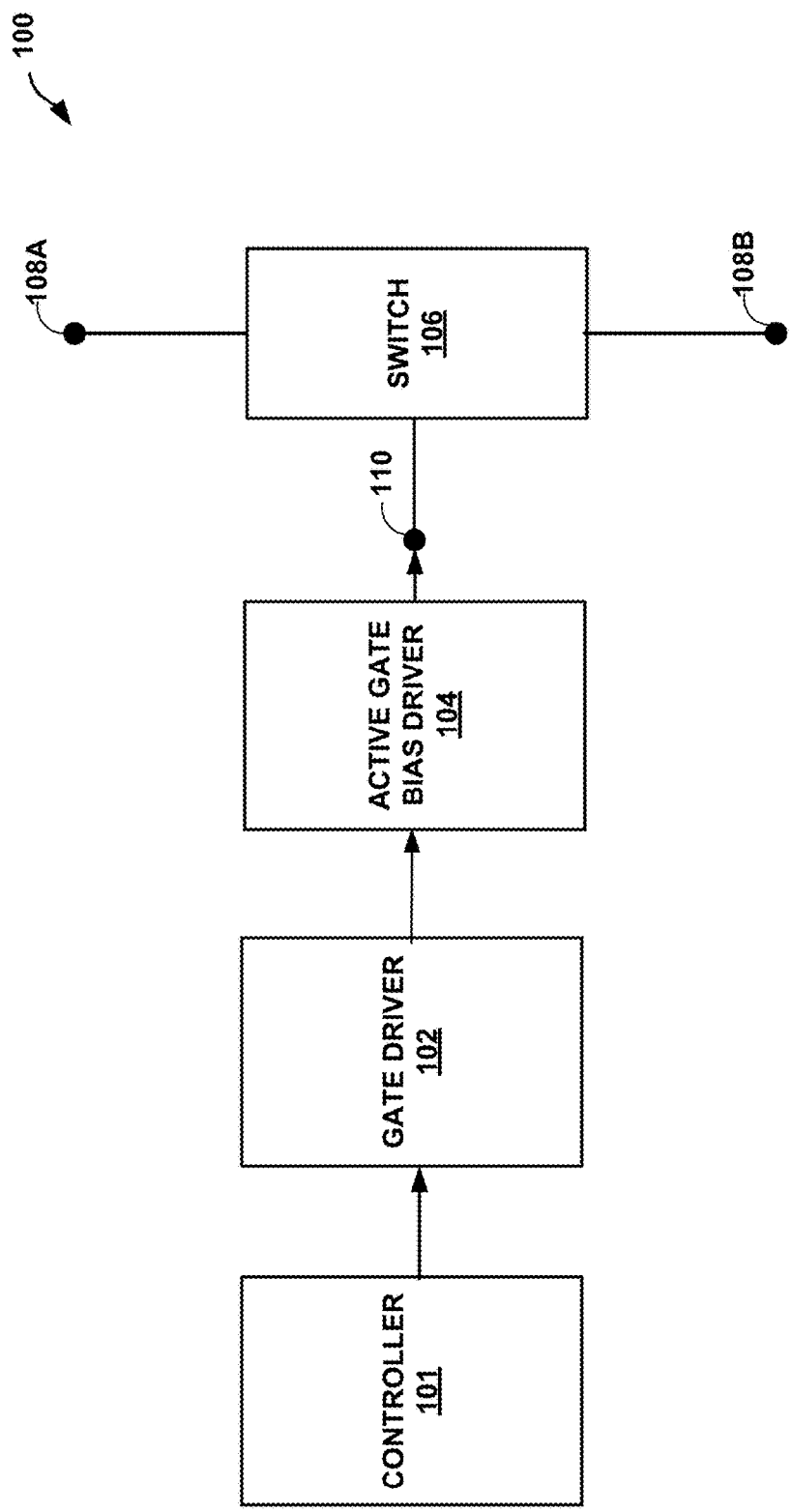
FIG. 1 is a block diagram illustrating an example system having active gate bias capability for reducing a reverse recovery charge in a switch, in accordance with one or more aspects of the present disclosure.

In some applications, such as motor drive applications, direct current (DC) to DC power converters, solar inverters, etc., the switches may operate with switching losses making up a significant portion of the total losses Such switches may be configured in an inverter, such as an intelligent power module (IPM). For example, a gate driver may alternatively activate a high side switch and a low side switch such that the high side switch is activated and the low side switch is deactivated during a first portion of a switching cycle and the high side switch is deactivated and the low side switch is activated during a second portion of the switching cycle.

A gate driver may use "dead time" to prevent the high and low side switch from being activated simultaneously. For example, the gate driver deactivates the high and low side switches during a first deadtime of a switching cycle. In the example, the gate driver activates the high side switch and deactivates the low side switch during a first portion of the switching cycle. In the example, the gate driver deactivates the high and low side switches during a second deadtime of the switching cycle. In the example, the gate driver deactivates the high side switch and activates the low side switch during a second portion of the switching cycle. However, recovery losses due to the accumulation of minority carriers during the dead time portion of switching transitions in such applications may be a substantial portion of the switching losses. For example, in an inverter using dead time and operating at a bus voltage of 320 V, with a motor phase current of 200 milli-amps root mean square ($mA_{rms}$), and a pulse width modulation (PWM) frequency of 20 kHz, the reverse recovery losses may account for 63% of a total power loss of the inverter.

A technical area of the problem may be related to high voltage switches used in IPMs for very low power motor drive applications (e.g., <200 W) for air conditioning and pump applications. As used herein a high voltage switch may refer to switches configured to operate between 250 volts and 1200 volts. In these applications, the motors may spend a vast majority of their operating life running under light load conditions at a fraction of the maximum load they were designed for. In these applications, IPMs may be operating in the 6-20 kHz frequency range. In these applications, turn-on switching losses of the switches may dominate over the conduction losses. A main contributor to the switching losses may be due to the recovery losses of the internal body diode of the switch. This recovery loss may be due to the storage of minority carriers during a dead time portion of the switching transitions. For example an inverter utilizing this IPMs may operate at bus voltage $V_{BUS}$=320 V, motor phase current $I_{motor}$=200 $mA_{rms}$, and PWM frequency $f_{sw}$=20 kHz, it may be found that reverse recovery losses of the conventional switch makeup 63% of the total inverter losses. Therefore, it may be very important to reduce the body diode recovery losses to improve the turn-on losses of the switch and improve overall system efficiency.

In an effort to reduce switching losses, electron irradiation and platinum (Pt) implants has been used. Even with these interventions, losses from the reverse recovery can amount to 40% of the total losses for example in a fan drive inverter operating at 20 kHz. Additionally some techniques may focus on controlling a reverse recovery body diode charge using gate bias control that relies on a diode (e.g., diode chains, a diode and resistors, etc.). However such techniques may bias a gate at a diode forward voltage drop of the diode (e.g., less than 0.7 V), which is not sufficient for high voltage switches. For example, such techniques may not work with high voltage (e.g., 250-1200 V) FET devices that have a gate threshold of several volts because the gate-bias effect is more pronounced at gate voltages much higher than a diode forward voltage drop of the diode (e.g., 0.7 V). In addition, adding an isolated diode device into a modern high voltage integrated circuit fabrication process may require special isolation techniques and process steps which may increase a fabrication cost for a resulting device tremendously. Further, if a non-isolated diode is used, when the non-isolated diode is forwarded, a carry will disrupt logic operation, which may cause latch-ups in a driver integrated circuit. Furthermore, such techniques may suffer from an effect that a gate-bias level drops with time inversely proportional to a gate capacitance and a diode impedance. Thus, such techniques may only be suitable for power converters that operate with very small dead times (e.g., 20 nanoseconds (ns)). Moreover, a temperature coefficient of a diode (e.g., −2.5 mV per degree Celsius) may not track a temperature coefficient of switch (e.g., −8.5 mV per degree Celsius) causing instabilities in high temperature operation. A gate may be constantly biased and therefore may result in sub threshold leakage as temperature rises. Moreover, the above mentioned techniques typically operate at very high frequencies, for instance, higher than 100 kHz and lower voltage classes (e.g., <100 V). These very high frequencies and lower voltage classes may be unsuitable for inverters used in motor drives which may operate at higher voltages (e.g., 250-1200 V) and much longer dead times (e.g., 2 milliseconds (ms)) and frequencies typically below 100 kHz.

Rather than relying on electron irradiation or a diode forward voltage drop, circuits and techniques are described for actively driving a voltage at a gate of a switch such that a reverse recovery charge in a switch is reduced. For example, a system may actively drive the voltage at the gate of the switch to account for variations in temperature of the switch, or other variations in switch and dynamically adjust its driving capability accordingly. In this way, the system may reduce losses that would otherwise occur in the switch.

FIG. 1 is a block diagram illustrating an example system 100 having active gate bias capability for reducing a reverse recovery charge in switch 106, in accordance with one or more aspects of the present disclosure. FIG. 1 shows system 100 which includes controller 101, gate driver 102, active gate bias driver 104, and switch 106. The gate drive output of active gate bias driver 104 is electrically coupled to the gate 110 of switch 106. System 100 may include additional components than those shown. In some examples, system 100 may be implemented as a single or multiple integrated circuit (IC) packages.

Controller 101 provides instructions to activate and deactivate switch 106. In some examples, controller 101 may be a modulation (e.g., pulse-width modulation) controller. For example, controller 101 may output, to gate driver 102 a high signal (e.g., logical '1') to indicate an instruction to activate switch 106 during a first portion of a pulse-width modulation cycle. In the example, controller 101 may output, to gate driver 102 a low signal (e.g., logical '0') to indicate an instruction to deactivate switch 106 during a second portion of the pulse-width modulation cycle. In some examples, however, controller 101 may output, to gate driver 102 a low signal (e.g., logical '0') to indicate an instruction to activate switch 106 and output, to gate driver 102 a high signal (e.g., logical '1') to indicate an instruction to deactivate switch 106.

In some examples, controller 101 may output an instruction to activate switch 106 using a pulse-width modulation cycle that includes a dead time. For instance, controller 101 may output, to gate driver 102, an instruction to deactivate switch 106 and a corresponding high side switch during a first portion of a switching cycle. During a second portion of the switching cycle, controller 101 may output, to gate driver 102, an instruction to activate the high side switch and output, to gate driver 102, an instruction to deactivate switch 106. During a third portion of the switching cycle, controller 101 may output, to gate driver 102, an instruction to deactivate the high side switch and switch 106. During a fourth portion of the switching cycle, controller 101 may output, to gate driver 102, an instruction to deactivate the high side switch and output, to gate driver 102, an instruction to activate switch 106. In this way, controller 101 may decrease a likelihood that the high side switch and switch 106 are inadvertently activated together.

Controller 101 may comprise any suitable arrangement of hardware, software, firmware, or any combination thereof, to perform the techniques attributed to controller 101 that are described herein. controller 101 may include any one or more microprocessors, digital signal processors (DSPs), application specific integrated circuits (ASICs), field programmable gate arrays (FPGAs), or any other equivalent integrated or discrete logic circuitry, as well as any combinations of such components. When controller 101 includes software or firmware, controller 101 may further include any necessary hardware for storing and executing the software or firmware, such as one or more memories and one or more processors or processing units. In general, a processing unit may include one or more microprocessors, DSPs, ASICs, FPGAs, or any other equivalent integrated or discrete logic circuitry, as well as any combinations of such components.

Switch 106 represents any conceivable semiconductor device that is configured to receive a gate driver signal from a driver, such as gate driver 102 and/or active gate bias driver 104. For example, switch 106 may be a Field-Effect-Transistor (FET). For instance, switch 106 may be a metal-oxide-semiconductor FET (MOSFET) used in a Switching Mode Power Supply (SMPS). Examples of a switch may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, p-channel MOSFET (pMOS), n-channel MOSFET (nMOS), double diffused MOSFET (DMOS), or any other type of MOSFET, or any combination of the same. In some examples, switch 106 may comprise a high-electron mobility transistor. Also, in some cases, switch 106 may comprise a gallium nitride (GaN) based transistor. Other materials may also be used to realize switch 106. In some examples, switch 106 may be a high voltage switch. As used herein a high voltage switch may refer to a switch configured to operate between 250 volts and 1200 volts.

Switch 106 includes three terminals however in other examples, switch 106 may include additional terminals. The gate 110 of switch 106 may be electrically coupled to active gate bias driver 104. Terminals 108A and 108B of switch 106 may be coupled to a voltage source and/or a load. In operation, switch 106 may receive at gate 110, a gate driver signal from active gate bias driver 104 that causes switch 106 to change operating states. Depending on the magnitude of the voltage of the gate driver signal at gate 110, switch 106 may activate (e.g., "switch-on") or deactivate (e.g., "switch-off"). When activated, switch 106 may conduct a current between terminals 108A and 108B of switch 106. When deactivate, switch 106 may cease conducting the current, and block a voltage between terminals 108A and 108B of switch 106.

Gate driver 102 provides driver capabilities to system 100 for driving switch 106. For example, gate driver 102 may output a turn-on voltage that causes switch 106 to activate or output a turn-off voltage that causes switch 106 to deactivate. As used herein, a turn-on voltage may refer to a voltage that exceeds a threshold voltage to activate switch 106 and a turn-off voltage may refer to a voltage that is less than the threshold voltage to deactivate switch 106. For instance, the turn-off voltage may be a ground of system 100. In some instances, the turn-off voltage may be a voltage at terminal 108B (e.g., a source of switch 106).

Gate driver 102 may be a stand-alone component of system 100 or may be part of a larger system or component of system 100. For example, gate driver 102 may be a discrete component or in other examples, gate driver 102 may be part of controller 101. In some examples, gate driver 102 may be a high voltage gate driver. As used herein a high voltage gate driver may refer to a gate driver configured to operate between 250 volts and 1200 volts.

Gate driver 102 may comprise any suitable arrangement of hardware, software, firmware, or any combination thereof, to perform the techniques attributed to gate driver 102 that are described herein. Gate driver 102 may include any one or more microprocessors, digital signal processors (DSPs), application specific integrated circuits (ASICs), field programmable gate arrays (FPGAs), or any other equivalent integrated or discrete logic circuitry, as well as any combinations of such components. When gate driver 102 includes software or firmware, gate driver 102 may further include any necessary hardware for storing and executing the software or firmware, such as one or more memories and one or more processors or processing units.

Active gate bias driver 104 may be a stand-alone component of system 100 or may be part of a larger system or component of system 100. For example, active gate bias driver 104 may be a discrete component or in other examples, active gate bias driver 104 may be part of a controller (e.g., a modulation controller that controls gate driver 102, active gate bias driver 104, switch 106, and other components of system 100). In some examples, active gate bias driver 104 may be a high voltage active gate bias driver. As used herein a high voltage active gate bias driver may refer to an active gate bias driver configured to operate between 250 volts and 1200 volts.

Active gate bias driver 104 may comprise any suitable arrangement of hardware, software, firmware, or any combination thereof, to perform the techniques attributed to active gate bias driver 104 that are described herein. Active gate bias driver 104 may include any one or more microprocessors, digital signal processors (DSPs), application specific integrated circuits (ASICs), field programmable gate arrays (FPGAs), or any other equivalent integrated or discrete logic circuitry, as well as any combinations of such components. When active gate bias driver 104 includes software or firmware, active gate bias driver 104 may further include any necessary hardware for storing and executing the software or firmware, such as one or more memories and one or more processors or processing units.

Active gate bias driver 104 provides active gate bias driver capabilities to system 100 for driving switch 106. For example, active gate bias driver 104 may actively drive a voltage at gate 110 of switch 106 to a bias voltage without exceeding a threshold voltage to activate switch 106. As used herein, a bias voltage may refer to a voltage that is less than a threshold voltage to activate switch 106 and greater than a ground voltage of system 100.

Rather than provide a minimum or ground voltage to gate 110 of switch 106 to deactivate switch 106, active gate bias driver 104 may actively drive a voltage at gate 110 of switch 106 to a bias voltage. For example, active gate bias driver 104 may be configured to actively drive a voltage at gate 110 of switch 106 to a bias voltage according to a reference voltage signal. Additionally, or alternatively, active gate bias driver 104 may be configured to actively drive a voltage at gate 110 of switch 106 to a bias voltage according to a current at switch 106 (e.g., flowing between terminal 108A and terminal 108B). In this way, a reverse recovery charge in switch 106 is reduced, thereby reducing losses that would otherwise occur in switch 106.

Figure 2:
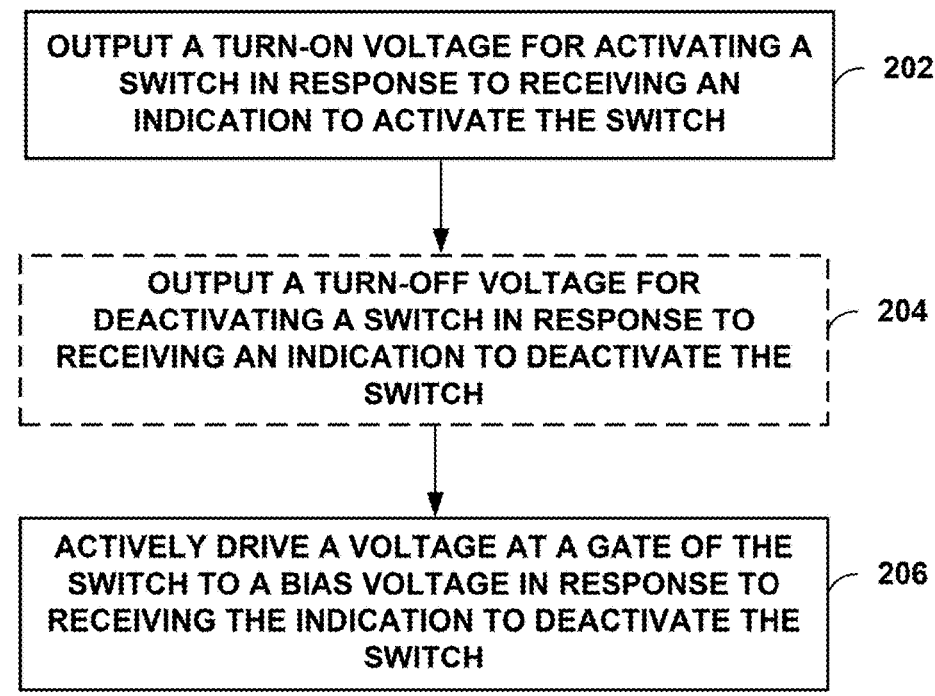
FIG. 2 is a flow diagram illustrating operations performed by an example system having active gate bias capability for reducing a reverse recovery charge in a switch, in accordance with one or more aspects of the present disclosure.

FIG. 2 is a flow diagram illustrating operations performed by an example system having active gate bias capability for reducing a reverse recovery charge in a switch, in accordance with one or more aspects of the present disclosure. For example, gate driver 102 and active gate bias driver 104 of system 100 of FIG. 1 may perform operations 202-206 of FIG. 2 to control switch 106 of system 100 of FIG. 1. FIG. 2 is described below in the context of system 100 of FIG. 1 for illustration purposes only.

In operation, gate driver 102 may output a turn-on voltage for activating switch 106 in response to receiving an indication to activate switch 106 (202). For example, in response to receiving, from controller 101, an indication (e.g., a high signal) to activate switch 106, gate driver 102 outputs a turn-on voltage to activate switch 106.

In some examples, gate driver 102 may optionally output a turn-off voltage for deactivating switch 106 in response to receiving an indication to deactivate switch 106 (204). For example, in response to receiving, from controller 101, an indication (e.g., a low signal) to deactivate switch 106, gate driver 102 outputs a ground voltage to deactivate switch 106. In any case, active gate bias driver 104 may actively drive a voltage at gate 110 of switch 106 to a bias voltage in response to receiving an indication to deactivate switch 106 (206). For example, in response to receiving, from controller 101, an indication (e.g., a low signal) to deactivate switch 106, active gate bias driver 104 actively drives a voltage at gate 110 of switch 106 to a bias voltage based on a temperature of switch 106, a current flowing from terminal 108A between 108 B, a voltage at gate 110, or a combination thereof.

Figure 3:
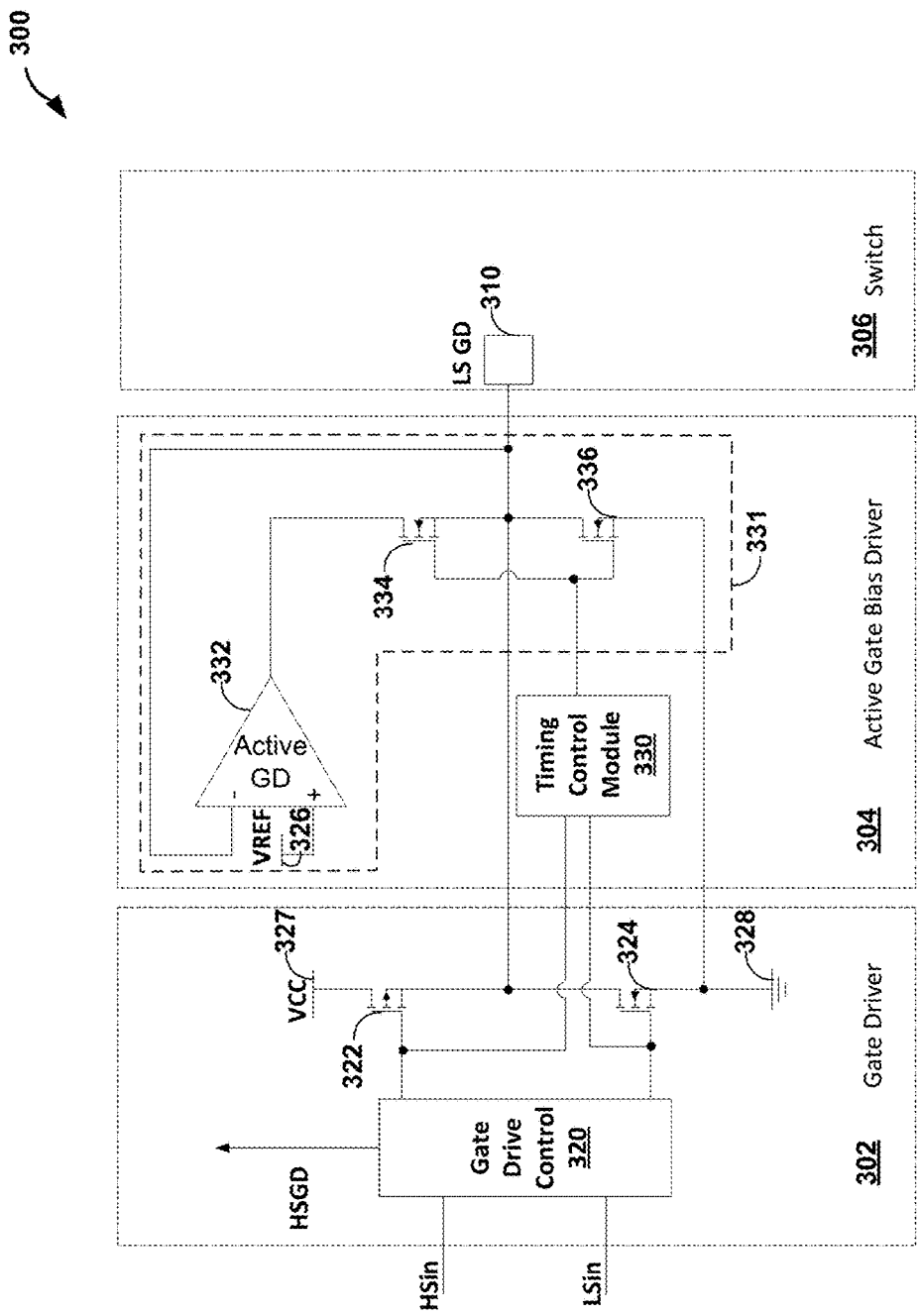
FIG. 3 is a block diagram illustrating a first example circuit having active gate bias capability for reducing a reverse recovery charge in a switch, in accordance with one or more aspects of the present disclosure.

FIG. 3 is a block diagram illustrating a first example circuit 300 having active gate bias capability for reducing a reverse recovery charge in a switch, in accordance with one or more aspects of the present disclosure. FIG. 3 shows gate driver 302, active gate bias driver 304, and switch 306. Gate driver 302 may be an example of gate driver 102 of FIG. 1. Active gate bias driver 304 may be an example of active gate bias driver 104 of FIG. 1. Switch 306 may be an example of switch 106 of FIG. 1. For instance, switch 306 may include gate 310, which may be an example of gate 110. FIG. 3 is described in the context of FIGS. 1 and 2 for exemplary purposes only.

Gate driver 302 may include gate drive control 320 and switching elements 322 and 324. Switching elements 322 and 324 may include, but are not limited to, a FET. As shown, switching element 322 may be a p-channel MOSFET, however, in other examples, switching element 322 may be different. Similarly, switching element 324 may be an n-channel MOSFET, however, in other examples, switching element 324 may be different. Gate drive control 320 may be configured to generate a first control signal in response to receiving an indication to activate switch 306. For example, in response to receiving, from controller 101, a low signal at the high side input (e.g., $HS_{in}$), gate drive control 320 may generate a first control signal (e.g., $V_{CC}$) that deactivates switching element 322 to electronically isolate gate 310 of switch 306 from turn-on voltage 327. In response, however, to receiving, from controller 101, a high signal at the high side input, gate drive control 320 may generate a first control signal (e.g., ground) that activates switching element 322 to generate a channel electronically connecting turn-on voltage 327 to gate 310 of switch 306. Similarly, gate drive control 320 may be configured to generate a second control signal in response to receiving an indication to deactivate switch 306. For example, in response to receiving, from controller 101, a low signal at the low side input (e.g., $LS_{in}$), gate drive control 320 may generate a second control signal (e.g., ground) that deactivates switching element 324 to electronically isolate gate 310 of switch 306 from ground 328. In response, however, to receiving, from controller 101, a high signal at the low side input, gate drive control 320 may generate a second control signal (e.g., $V_{CC}$) that activates switching element 324 to generate a channel electronically connecting ground 328 to gate 310 of switch 306. In this way, gate driver 302 may selectively connect gate 310 of switch 306 to either turn-on voltage 327 or ground 328.

Active gate bias driver 304 may include timing control module 330 and active gate bias module 331. In some examples, timing control module 330 may be an operational transconductance amplifier. Timing control module 330 may be configured to output an indication to provide an active gate bias voltage for deactivating the switch based on the first and second control signals. For example, in response to receiving, from gate drive control 320, a first control signal indicating to deactivate switching element 322 and a second control signal indicating to deactivate switching element 324, timing control module 330 may cause active gate bias module 331 to provide an active gate bias to gate 310 of switch 306. In the example, in response, however, to receiving, from gate drive control 320, a first control signal indicating to activate switching element 322 timing control module 330 may cause active gate bias module 331 to refrain from providing an active gate bias to gate 310 of switch 306. Similarly, in the example, in response to receiving, from gate drive control 320, a second control signal indicating to activate switching element 324 timing control module 330 may cause active gate bias module 331 to refrain from providing an active gate bias to gate 310 of switch 306. In this way, timing control module 330 may activate active gate bias module 331 during a dead time switching of switch 306.

Active gate bias module 331 may actively drive a voltage at gate 310 of switch 306 at various portions of a switching cycle. For example, active gate bias module 331 may actively drive a voltage at gate 310 of switch 306 to a bias voltage during a dead time of switch 306. For instance, in response to receiving, from gate drive control 320, a first control signal indicating to deactivate (e.g., low signal) switching element 322 and a second control signal indicating to deactivate switching element 324, timing control module 330 may determine that switch 306 is operating in a dead time and, in response to determining that switch 306 is operating in the dead time, may cause active gate bias module 331 to actively drive a voltage at gate 310 of switch 306 to the bias voltage during the dead time of switch 306. Additionally, or alternatively, active gate bias module 331 may actively drive a voltage at gate 310 of switch 306 to a bias voltage during a body diode conduction of switch 306. Additionally, or alternatively, active gate bias module 331 may actively drive a voltage at gate 310 of switch 306 to a bias voltage when switch 306 is deactivated. For instance, in response to receiving, from gate drive control 320, a first control signal indicating to deactivate switching element 322 and a second control signal indicating to activate switching element 324, timing control module 330 may determine that switch 306 is deactivated and, in response to determining that switch 306 is deactivated, may cause active gate bias module 331 to actively drive a voltage at gate 310 of switch 306 to the bias voltage during the dead time of switch 306.

In some examples, active gate bias module 331 may actively drive a voltage at gate 310 of switch 306 to different bias voltage for different portions of a switching cycle. For example, active gate bias module 331 may actively drive a voltage at gate 310 of switch 306 to a first bias voltage during a dead time of switch 306 before switch 306 is activated. In the example, active gate bias module 331 may actively drive a voltage at gate 310 of switch 306 to a second bias voltage during a dead time of switch 306 before switch 306 is deactivated.

Active gate bias module 331 may include differential amplifier 332, switching elements 334 and 336. Switching elements 334 and 336 may include, but are not limited to, a FET. In the example of FIG. 3, active gate bias module 331 is configured to actively drive a voltage at gate 310 of switch 306 to a bias voltage in response to receiving an indication to provide the active gate bias voltage for deactivating switch 306. For example, in response to receiving, from timing control module 330, a signal to activate (e.g., high signal) switching elements 334 and 336, switching elements 334 and 336 generate an electrical channel between the output of differential amplifier 332 to gate 310 of switch 306, thereby electronically connecting differential amplifier 332 to gate 310 of switch 306.

In the example of FIG. 3, active gate bias driver 304 is configured to receive a reference voltage signal. For instance, differential amplifier 332 receives the reference voltage signal at a negative input terminal. In the example, active gate bias driver 304 is configured to actively drive the voltage at gate 310 of switch 306 to the bias voltage according to the reference voltage signal. Additionally, or alternatively, in some examples, active gate bias driver 304 is configured to receive an indication of a gate voltage at gate 310 of switch 306 and to actively drive the voltage at gate 310 of switch 306 to the bias voltage according to the indication of the gate voltage. For instance, differential amplifier 332 actively drives the voltage at gate 310 of switch 306 to the bias voltage to minimize a difference between the voltage at gate 310 and the reference voltage signal.

A reference voltage signal may be output from reference voltage source 326 having a temperature coefficient corresponding to a temperature coefficient of a gate threshold ($V_{th}$) for switch 306. For example, in response to switch 306 heating up, the gate threshold ($V_{th}$) for switch 306 decreases. In the example, in response to reference voltage source 326 heating up, the reference voltage signal for switch 306 decreases. Similarly, in response to switch 306 cooling, the gate threshold ($V_{th}$) for switch 306 increases. In the example, in response to reference voltage source 326 cooling, the reference voltage signal for switch 306 increase. Reference voltage source 326 and switch 306 may be spatially proximate, such that a change in temperature in the switch 306 is translated into a corresponding change in temperature in reference voltage source 326. Additionally, or alternatively, reference voltage source 326 and switch 306 may be spatially proximate, such that a change in temperature in the reference voltage source 326 is translated into a corresponding change in temperature in switch 306. In this way, active gate bias driver 304 may match a temperature response of switch 306 to avoid temperature related dynamic effects like shoot through and undesired turn-on in switch 306, thereby reducing recovery losses of switch 306.

Reference voltage source 326 may select an optimum gate voltage shape during dead time switching and/or during body diode conduction of switch 306 to reduce sub-threshold leakage when a gate bias is applied to further reduce power loss. For example, active gate bias module 331 may actively drive a voltage at gate 310 of switch 306 to a first bias voltage during a first dead time of switch 306 before switch 306 is activated. In the example, active gate bias module 331 may actively drive a voltage at gate 310 of switch 306 to a second bias voltage during a second dead time of switch 306 before switch 306 is deactivated. In this way, active gate bias driver 304 may reduce a sub-threshold leakage during the deadtime while the gate bias is applied, thereby reducing the recovery losses.

Figure 4:
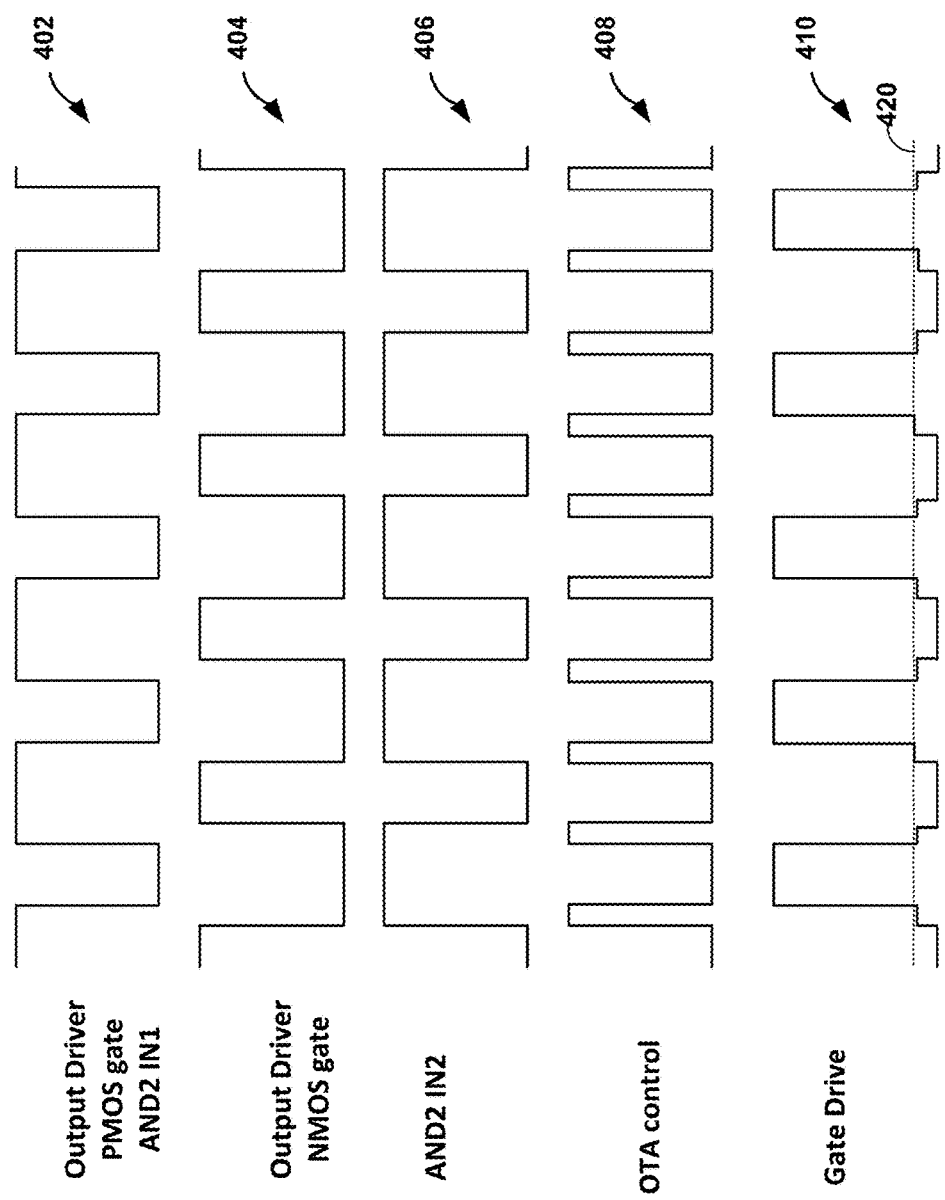
FIG. 4 is a diagram illustrating signals output by the example circuit shown in FIG. 3.

FIG. 4 is a diagram illustrating signals output by the example circuit shown in FIG. 3. FIG. 4 is described in the context of FIGS. 1-3 for exemplary purposes only. In the example of FIG. 4, gate drive control 320 outputs, to a gate of switching element 322 (e.g., a PMOS) first control signal 402 and outputs, to a gate of switching element 324 (e.g., a NMOS) second control signal 404. FIG. 4 illustrates a second control signal 404 that is inverted as inverted second control signal 406. In the example of FIG. 4, timing control module 330 receives first control signal 402 and second control signal 404 and outputs, to switching elements 334 and 336 of active gate bias module 331, a timing control signal 408. As shown, timing control signal 408 may indicate a dead time of switch 306. That is, timing control signal 408 may indicate a portion of a pulse width modulation signal where switching elements 322 and 324 are deactivated. In any case, active gate bias module 331 actively drives a voltage 410 at gate 310 of switch 306 according to timing control signal 408. As shown, active gate bias module 331 actively drives a voltage 410 at gate 310 of switch 306 to bias voltage 420 when the timing control signal 408 indicates the dead time of switch 306 (e.g., when timing control signal 408 is high).

Figure 5:
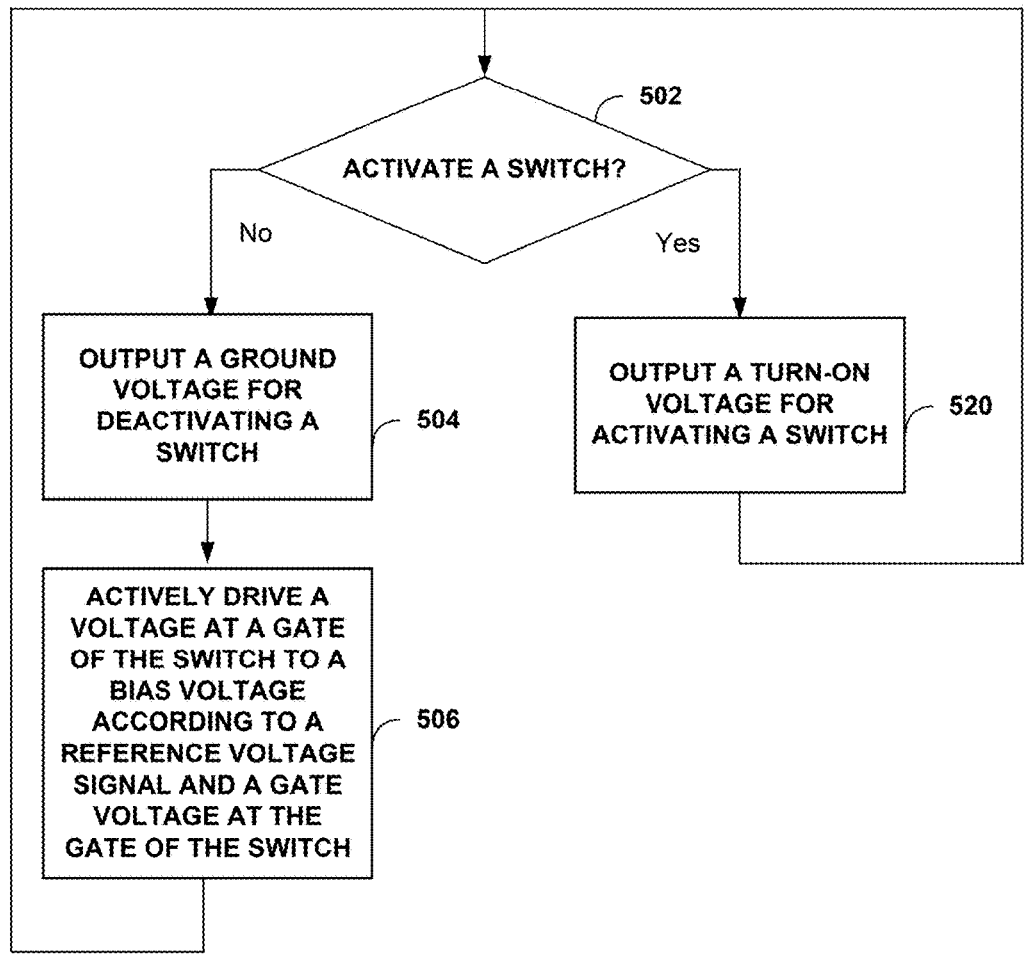
FIG. 5 is a flow diagram illustrating operations performed by the example circuit shown in FIG. 3.

FIG. 5 is a flow diagram illustrating operations performed by the example circuit shown in FIG. 3. FIG. 5 is described in the context of FIGS. 1-4 for exemplary purposes only. In operation, gate driver 302 may determine whether to activate switch 306 (502). For example, gate driver 302 may determine to activate switch 306 in response to receiving, from controller 101, a high signal at the high input (e.g., $HS_{in}$) and a low signal at the low input (e.g., $LS_{in}$). In response to determining to activate switch 306, gate driver 302 may output a turn-on voltage for activating switch 306 (520). For example, in response to receiving, from controller 101, an indication (e.g., a high signal) to activate switch 306, gate driver 302 outputs a turn-on voltage to activate switch 306.

In response, however, to determining to deactivate switch 306, gate driver 302 may output a turn-off voltage for deactivating switch 306 (504). For example, in response to receiving, from controller 101, an indication (e.g., a low signal) to deactivate switch 306, gate driver 302 outputs a turn-off voltage to activate switch 306. In the example, active gate bias driver 304 may actively drive a voltage at gate 310 of switch 306 to a bias voltage according to a reference voltage signal and a gate voltage at gate 310 of switch 306 (506). For example, when the timing control signal 408 indicates the dead time of switch 306, differential amplifier 332 of active gate bias driver 304 actively drives the voltage at gate 310 of switch 306 to the bias voltage to minimize a difference between the voltage at gate 310 and the reference voltage signal.

Figure 6:
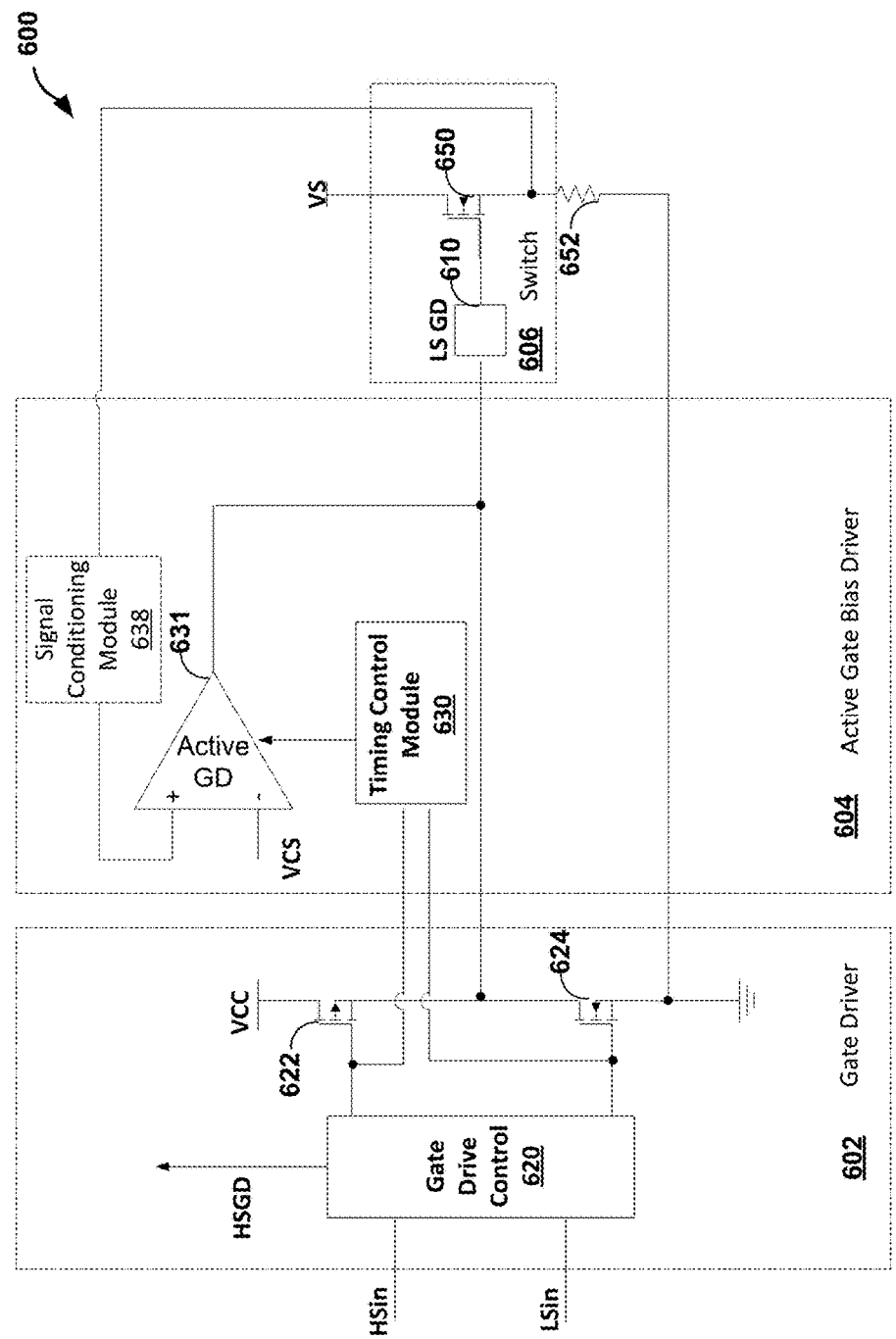
FIG. 6 is a block diagram illustrating a second example circuit having active gate bias capability for reducing a reverse recovery charge in a switch, in accordance with one or more aspects of the present disclosure.

FIG. 6 is a block diagram illustrating a second example circuit 600 having active gate bias capability for reducing a reverse recovery charge in a switch, in accordance with one or more aspects of the present disclosure. FIG. 6 shows gate driver 602, active gate bias driver 604, and switch 606. Gate driver 602 may be an example of gate driver 102 of FIG. 1 and/or an example of gate driver 302 of FIG. 3. For example, gate drive control 620 may be an example of gate drive control 320 of FIG. 3 and/or switching elements 622 and 624 may be examples of switching elements 322 and 324, respectively, of FIG. 3. Active gate bias driver 604 may be an example of active gate bias driver 104 of FIG. 1 and/or an example of active gate bias driver 304 of FIG. 3. For example, timing control module 630 may be an example of timing control module 330, active gate bias module 631 may be an example of active gate bias module 331. Switch 606 may be an example of switch 106 of FIG. 1. For instance, switch 606 may include gate 610, which may be an example of gate 610. FIG. 6 is described in the context of FIGS. 1-5 for exemplary purposes only.

In the example of FIG. 6, active gate bias driver 604 may be configured to receive an indication of a current flowing through switch 606. For instance, active gate bias driver 604 may receive a voltage at resistive element 652 that indicates a current flowing through switch 606. In some examples, signal conditioning module 638 may optionally condition the voltage output by resistive element 652. In any case, active gate bias driver 604 may be configured to actively drive the voltage at gate 610 of switch 606 to the bias voltage according to the indication of the current flowing through switch 606. For instance, a differential amplifier of active gate bias module 631 may actively drive the voltage at gate 610 of switch 606 to the bias voltage to minimize a difference between the voltage at resistive element 652 and a reference voltage signal (e.g., $V_{CS}$).

Accordingly, rather than relying on a voltage reference internally, active gate bias driver 604 may sense current during a recovery time and controlled through an integrated active clamp to minimize power loss during recovery time. Active gate bias driver 604 may be configured for closed loop active gate control to clamp a gate voltage at gate 610 during Miller induced gate turn on.

Figure 7:
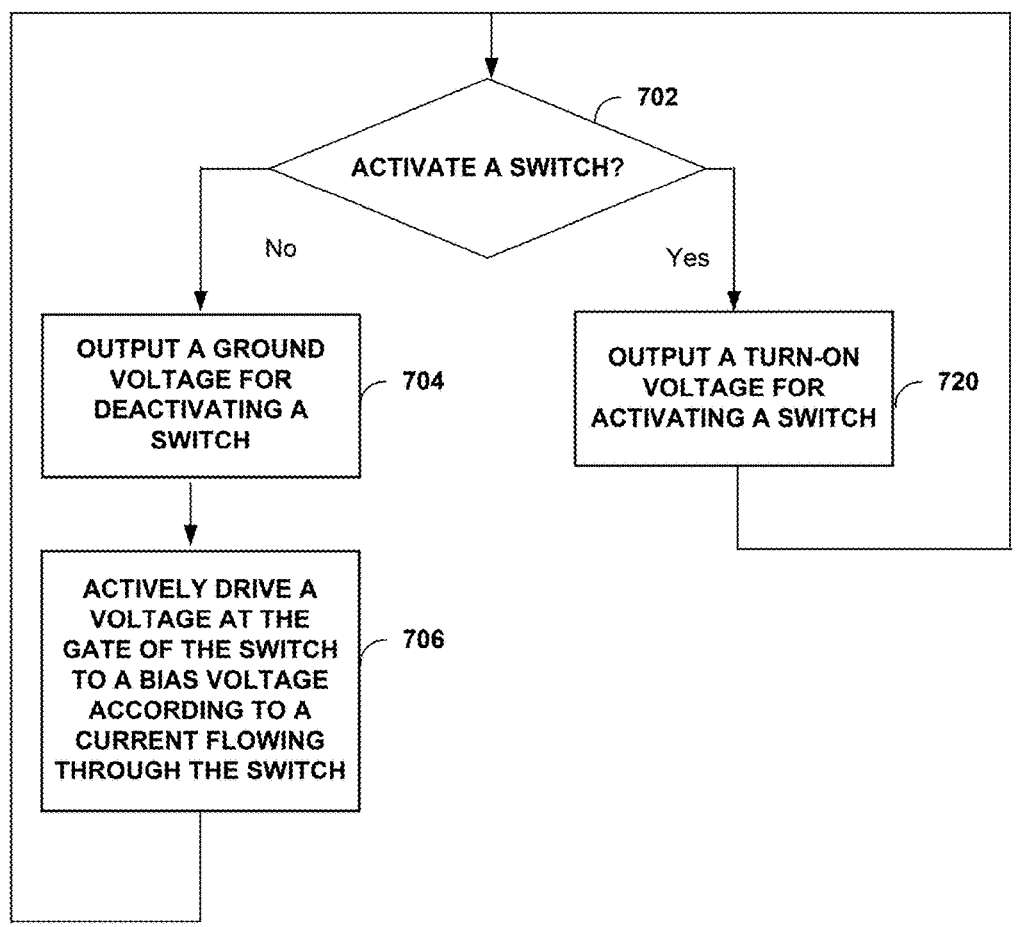
FIG. 7 is a flow diagram illustrating operations performed by the example circuit shown in FIG. 6.

FIG. 7 is a flow diagram illustrating operations performed by the example circuit shown in FIG. 6. FIG. 7 is described in the context of FIGS. 1-6 for exemplary purposes only. In operation, gate driver 602 may determine whether to activate switch 606 (702). For example, gate driver 602 may determine to activate switch 606 in response to receiving, from controller 101, a high signal at the high input (e.g., $HS_{in}$) and a low signal at the low input (e.g., $LS_{in}$). In response to determining to activate switch 606, gate driver 602 may output a turn-on voltage for activating switch 606 (720). For example, in response to receiving, from controller 101, an indication (e.g., a high signal) to activate switch 606, gate driver 602 outputs a turn-on voltage to activate switch 606.

In response, however, to determining to deactivate switch 606, gate driver 602 may output a turn-off voltage for deactivating switch 606 (704). For example, in response to receiving, from controller 101, an indication (e.g., a low signal) to deactivate switch 606, gate driver 602 outputs a turn-off voltage to activate switch 606. In the example, active gate bias driver 604 may actively drive a voltage at gate 610 of switch 606 to a bias voltage according to a current flowing through switch 306 (706). For example, when the timing control signal 408 indicates the dead time of switch 606, a differential amplifier of active gate bias driver 604 actively drives the voltage at gate 610 of switch 606 to the bias voltage to minimize a difference between the voltage at resistive element 652 and a reference voltage signal.

Figure 8:
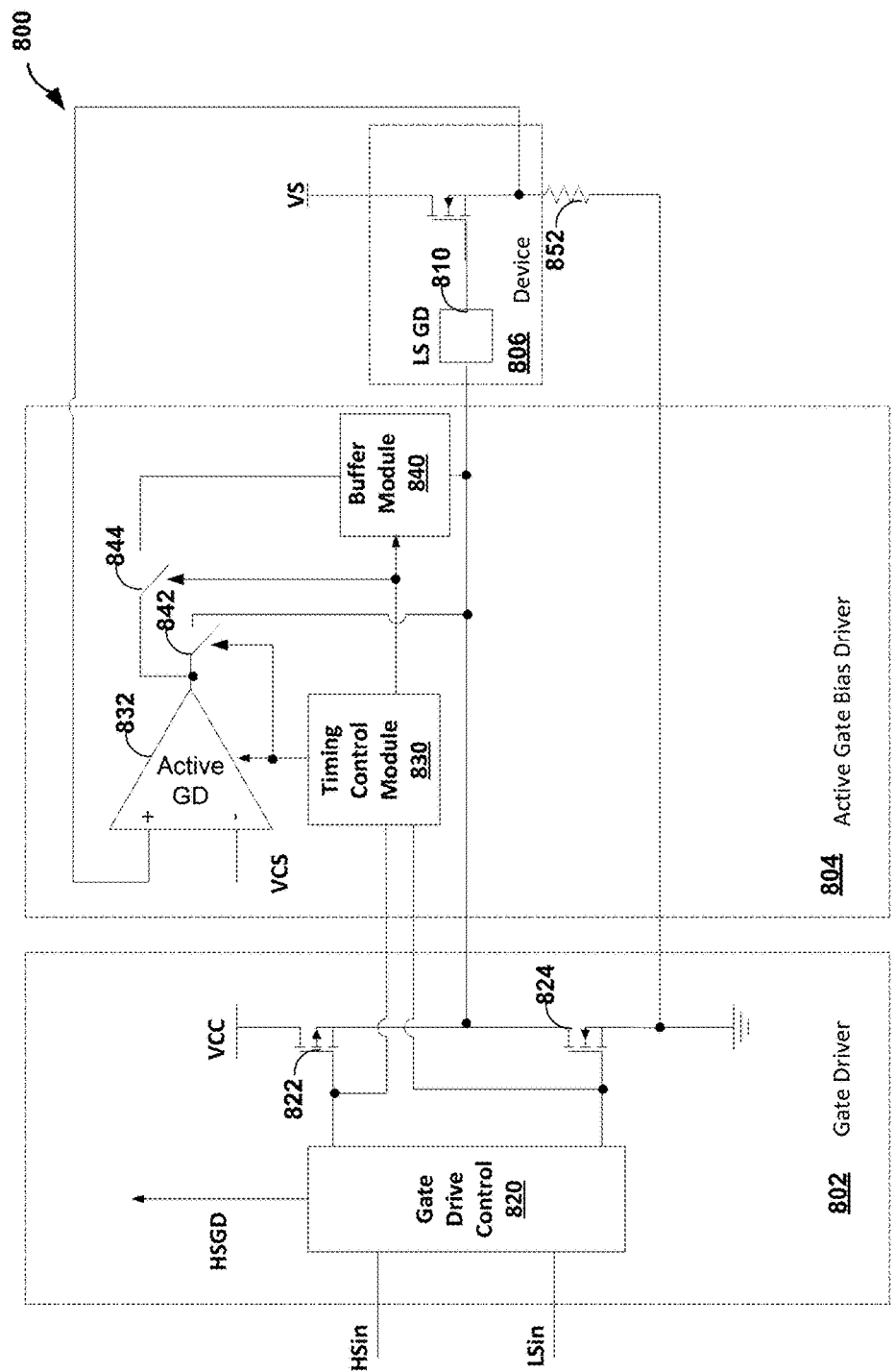
FIG. 8 is a block diagram illustrating a third example circuit having active gate bias capability for reducing a reverse recovery charge in a switch, in accordance with one or more aspects of the present disclosure.

FIG. 8 is a block diagram illustrating a third example circuit 800 having active gate bias capability for reducing a reverse recovery charge in a switch, in accordance with one or more aspects of the present disclosure. FIG. 8 shows gate driver 802, active gate bias driver 804, and switch 806. Gate driver 802 may be an example of gate driver 102 of FIG. 1. Gate driver 802 may be an example of gate driver 303. For instance, gate drive control 620 may be an example of gate drive control 320 of FIG. 3 and/or switching elements 822 and 824 may be examples of switching elements 322 and 324, respectively, of FIG. 3. Gate driver 802 may be an example of gate driver 602. For instance, switching elements 822 and 824 may be examples of switching elements 622 and 624, respectively, of FIG. 6. Active gate bias driver 804 may be an example of active gate bias driver 104 of FIG. 1. Differential amplifier 832 may be an example of differential amplifier 332 of FIG. 3 and/or differential amplifier 632 of FIG. 6. Timing control module 830 may be an example of timing control module 330, active gate bias module 831 may be an example of active gate bias module 331. Switch 806 may be an example of switch 106 of FIG. 1. For instance, switch 806 may include gate 810, which may be an example of gate 110 of FIG. 1. Resistive element 852 may be substantially similar to resistive element 652 of FIG. 6. FIG. 8 is described in the context of FIGS. 1-7 for exemplary purposes only.

In the example of FIG. 8, active gate bias driver 804 may include buffer module 840 and switching elements 842 and 844. Switching elements 842 and 844 may include, but are not limited to, a FET. Buffer module 840 may be configured to store a buffered voltage to correspond to a detected voltage at gate 810. For instance, buffer module 840 may include one or more capacitive elements. Timing control module 830 may be configured to cause active gate bias driver 804 to initially output, to gate 810 of switch 806, a buffered voltage when actively driving the voltage at gate 810 of switch 806 to the bias voltage. For instance, timing control module 830 may activate switching element 844 to generate an electrical channel between buffer module 840 and gate 810 of switch 806 for an initial portion (less than 20%) of a dead time of a switching cycle. In some examples, active gate bias driver 804 may be configured to modify the buffered voltage to correspond to a detected voltage at gate 810 of switch 806. In the example, the detected voltage may be detected after initially outputting the buffered voltage and prior to activating switch 806. For instance, timing control module 830 may activate switching element 844 at a final portion (e.g., the last 20%) of the dead time of the switching cycle, to store a voltage detected at gate 810 of switch 806 in buffer module 840. In this way, to improve an active generic disturbance (GD) close-loop response speed, a previous recovery cycle gate voltage may be stored in a gate voltage sense and hold circuitry of buffer module 840. During a standard gate drive period, voltage at the gate voltage sense and hold circuitry of buffer module 840 may be buffered on to the active GD output. In the next recovery cycle, the active GD may quickly establish the operating point to improve the speed during recovery period.

Figure 9:
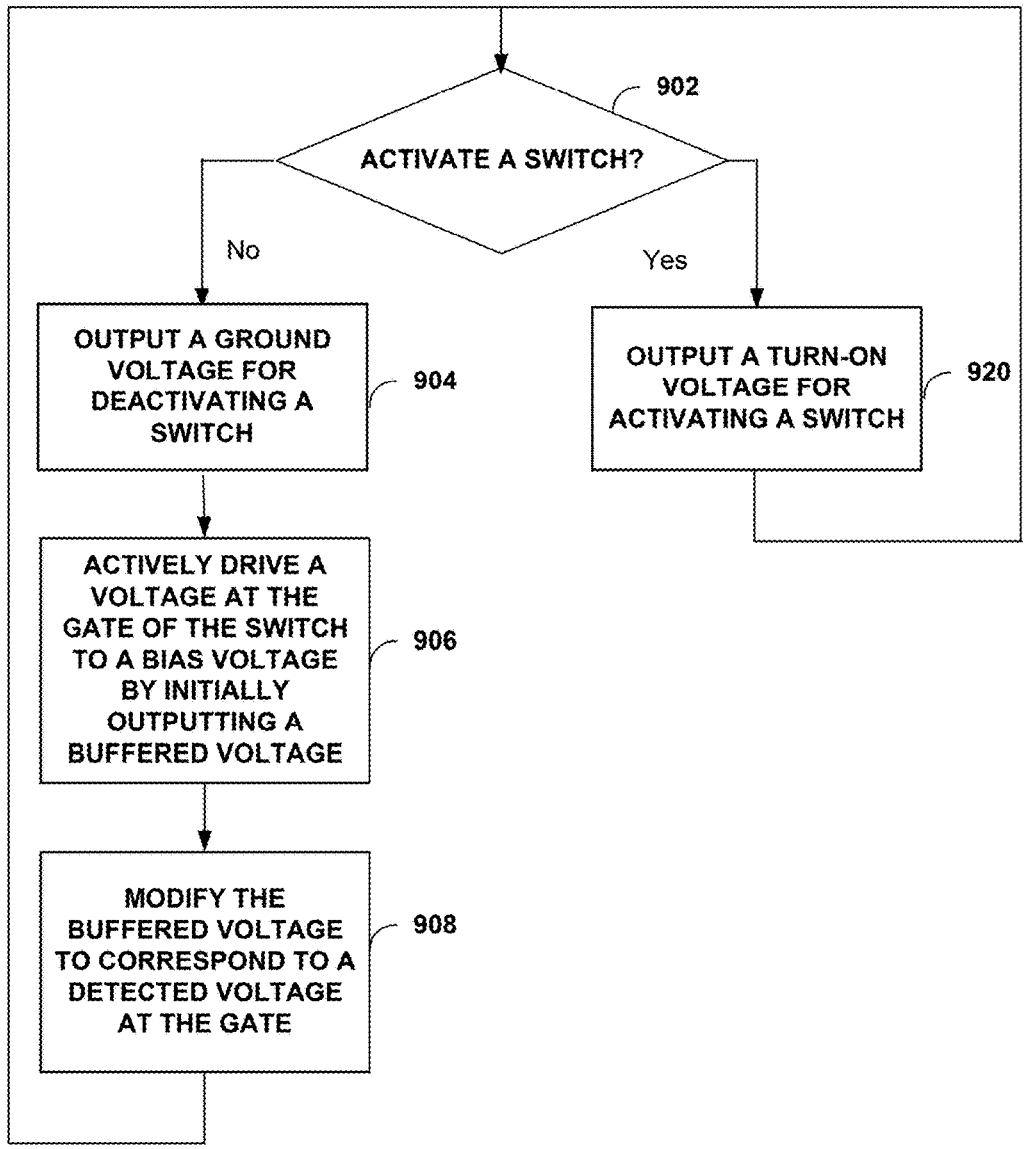
FIG. 9 is a flow diagram illustrating operations performed by the example circuit shown in FIG. 8.

FIG. 9 is a flow diagram illustrating operations performed by the example circuit shown in FIG. 8. FIG. 9 is described in the context of FIGS. 1-8 for exemplary purposes only. In operation, gate driver 802 may determine whether to activate switch 806 (902). For example, gate driver 802 may determine to activate switch 806 in response to receiving, from controller 101, a high signal at the high input (e.g., $HS_{in}$) and a low signal at the low input (e.g., $LS_{in}$). In response to determining to activate switch 806, gate driver 802 may output a turn-on voltage for activating switch 806 (920). For example, in response to receiving, from controller 101, an indication (e.g., a high signal) to activate switch 806, gate driver 802 outputs a turn-on voltage to activate switch 806.

In response, however, to determining to deactivate switch 806, gate driver 802 may output a turn-off voltage for deactivating switch 806 (904). For example, in response to receiving, from controller 101, an indication (e.g., a low signal) to deactivate switch 806, gate driver 802 outputs a turn-off voltage to activate switch 806. In the example, active gate bias driver 804 may actively drive a voltage at gate 810 of switch 806 to a bias voltage (906). For example, when the timing control signal 408 indicates the dead time of switch 806, timing control module 830 may activate switching element 844 to generate an electrical channel between buffer module 840 and gate 810 of switch 806 for an initial portion (less than 20%) of a dead time of a switching cycle. In the example, active gate bias driver 804 may modify the buffered voltage to correspond to a detected voltage at the gate (906). For example, when the timing control signal 408 indicates a final portion of the dead time of switch 806, timing control module 830 may activate switching element 844 to generate an electrical channel between buffer module 840 and gate 810 of switch 806 to store a voltage at gate 810 of switch 806 in buffer module 840.

Figure 10:
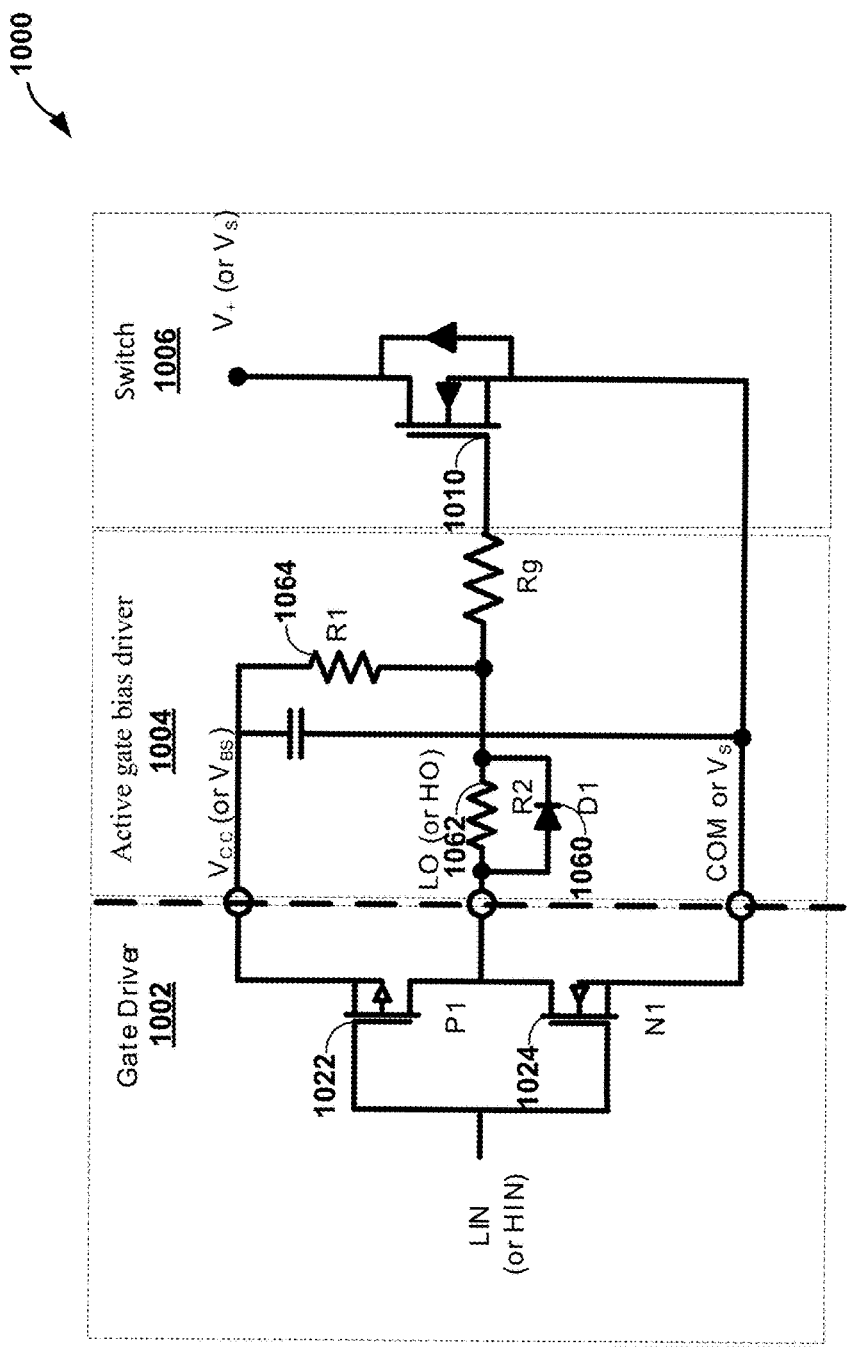
FIG. 10 is a block diagram illustrating a fourth example circuit having active gate bias capability for reducing a reverse recovery charge in a switch, in accordance with one or more aspects of the present disclosure.

FIG. 10 is a block diagram illustrating a fourth example circuit 1000 having active gate bias capability for reducing a reverse recovery charge in a switch, in accordance with one or more aspects of the present disclosure. FIG. 10 shows gate driver 1002, active gate bias driver 1004, and switch 1006. Gate driver 1002 may be an example of gate driver 102 of FIG. 1. Gate driver 1002 may be an example of gate driver 302 of FIG. 3. For instance, switching elements 1022 and 1024 may be examples of switching elements 322 and 324, respectively, of FIG. 3. Active gate bias driver 1004 may be an example of active gate bias driver 104 of FIG. 1. Switch 1006 may be an example of switch 106 of FIG. 1. For instance, switch 1006 may include gate 1010, which may be an example of gate 110 of FIG. 1. FIG. 10 is described in the context of FIGS. 1-9 for exemplary purposes only.

Gate driver 1002 may be configured to activate switch 1006. For example, active gate bias driver 1004 may receive a signal (e.g., "LIN") that activates switching element 1022 and deactivates switching element 1024. In some instances, switching element 1022 has a channel resistance of 75 to 2 kilo-ohms (kΩ). In the example, diode 1060 bypasses resistive element 1062.

Gate driver 1002 may be configured to deactivate switch 1006. For example, active gate bias driver 1004 may receive a signal (e.g., "HIN") that deactivates switching element 1022 and activates switching element 1024. In some instances, when switching element 1024 is activated, active gate bias driver 1004 biases gate 1010 according to the following equation.

$$V_K = (R_{ON,N1} + R_2)/(R_{ON,N1} + R_2 + R_1) V_{CC}$$

In the above equation, $R_{ON,N1}$ is an on resistance of switching element 1024, $R_1$ is a resistance of resistive element 1064, $R_2$ is a resistance of resistive element 1062. In the above equation $R_2$ may be selected so that $V_K$ is approximately at an optimum gate bias (e.g., 2 volts) when switching element 1024 is activated, $R_2$ is (substantially) greater than $R_{P1}$ (i.e., a resistance of switching element 1022), and $R_2$ is approximately equal to $R_{N1}$ (i.e., a resistance of switching element 1024).

Figure 11:
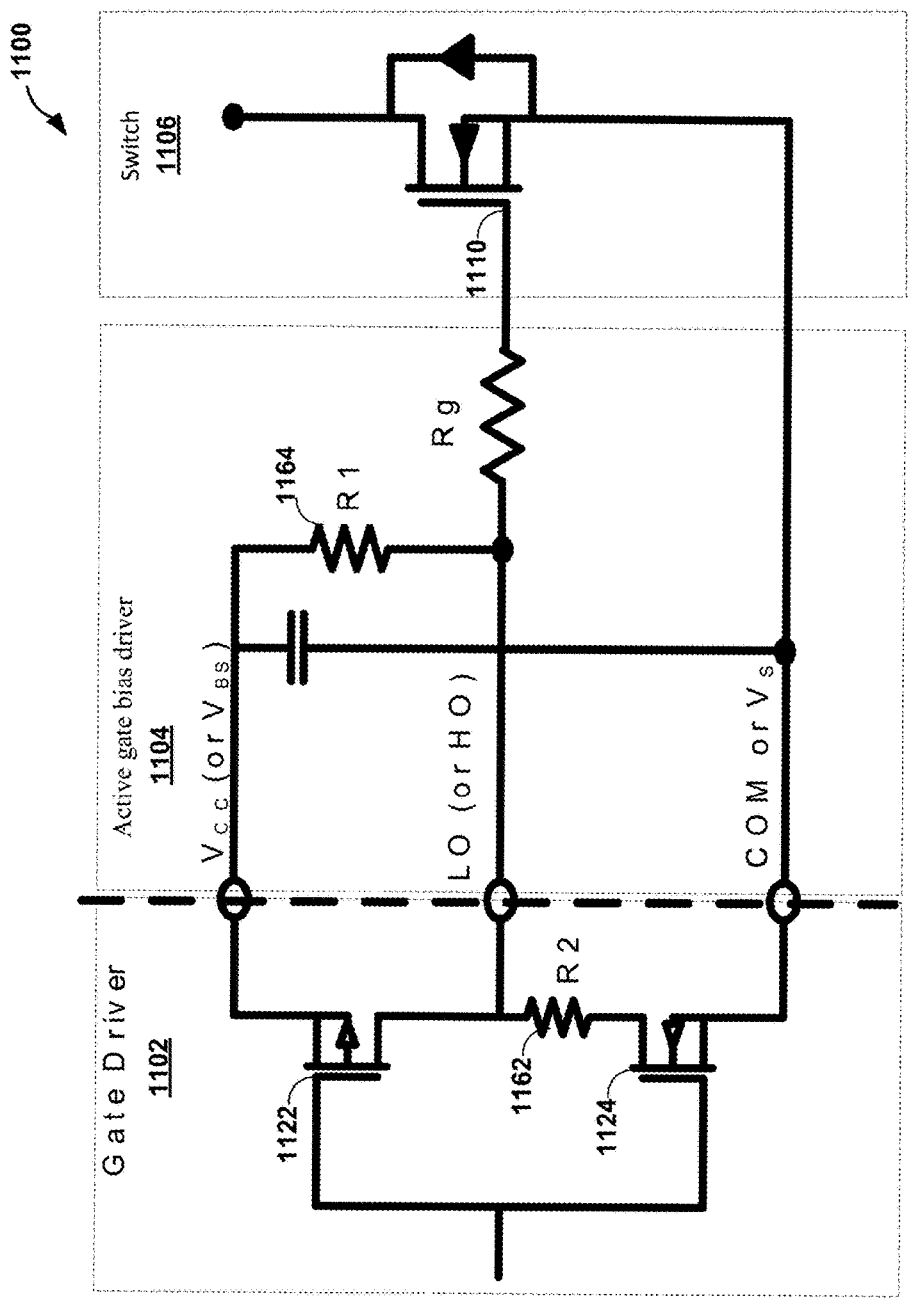
FIG. 11 is a block diagram illustrating a fifth example circuit having active gate bias capability for reducing a reverse recovery charge in a switch, in accordance with one or more aspects of the present disclosure.

FIG. 11 is a block diagram illustrating a fifth example circuit 1100 having active gate bias capability for reducing a reverse recovery charge in a switch, in accordance with one or more aspects of the present disclosure. FIG. 11 shows gate driver 1102, active gate bias driver 1104, and switch 1106. Gate driver 1102 may be an example of gate driver 1002 of FIG. 10 and/or gate driver 302 of FIG. 3. For example, switching elements 1122 and 1124 may be examples of switching elements 1022 and 1024, respectively, of FIG. 10. Active gate bias driver 1004 may be an example of gate bias driver 1004 of FIG. 10. Switch 1106 may be an example of switch 1006 of FIG. 10. For instance, switch 1106 may include gate 1110, which may be an example of gate 1010 of FIG. 10. FIG. 11 is described in the context of FIGS. 1-10 for exemplary purposes only.

Active gate bias driver 1104 may be similar to active gate bias driver 1004 of FIG. 10. For instance, active gate bias driver 1104 may include resistive element 1164, which may be substantially similar to resistive element 1064 of FIG. 10. However, rather than including resistive element 1062 in active gate bias driver 1004 as shown in FIG. 10, active gate bias driver 1104 omits a second resistive element, and instead gate driver 1102 includes resistive element 1162, which may be substantially similar to resistive element 1062.

Figure 12:
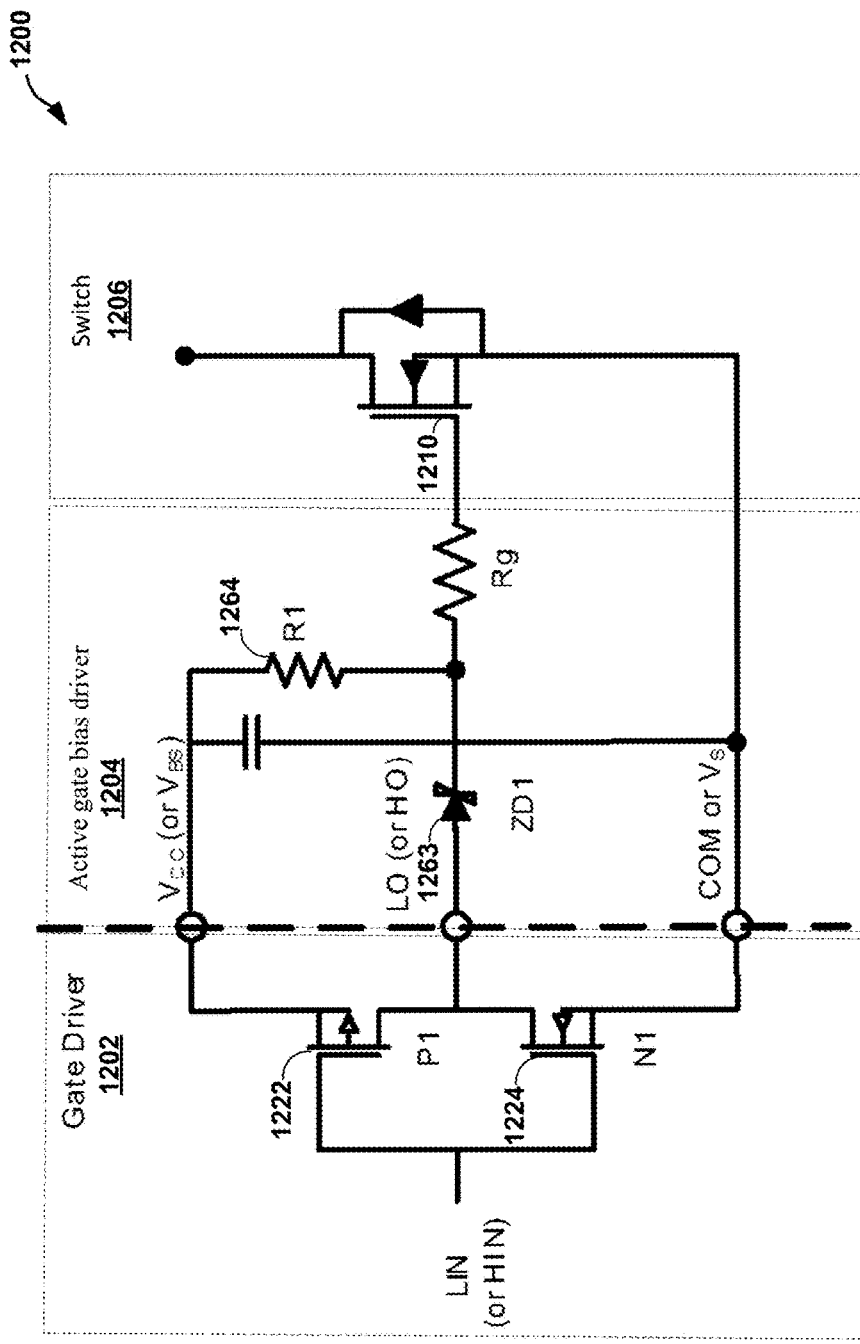
FIG. 12 is a block diagram illustrating a sixth example circuit having active gate bias capability for reducing a reverse recovery charge in a switch, in accordance with one or more aspects of the present disclosure.

FIG. 12 is a block diagram illustrating a sixth example circuit 1200 having active gate bias capability for reducing a reverse recovery charge in a switch, in accordance with one or more aspects of the present disclosure. FIG. 12 shows gate driver 1202, active gate bias driver 1204, and switch 1206. Gate driver 1202 may be an example of gate driver 102 of FIG. 1 and/or an example of gate driver 302 of FIG. 3. For example, switching elements 1222 and 1224 may be examples of switching elements 322 and 324, respectively, of FIG. 3. Active gate bias driver 1204 may be an example of active gate bias driver 104 of FIG. 1. Switch 1206 may be an example of switch 106 of FIG. 1. For instance, switch 1206 may include gate 1210, which may be an example of gate 110 of FIG. 1. FIG. 12 is described in the context of FIGS. 1-11 for exemplary purposes only.

Active gate bias driver 1204 may be similar to active gate bias driver 1004 of FIG. 10. For instance, active gate bias driver 1204 may include resistive element 1264, which may be substantially similar to resistive element 1064 of FIG. 10.

However, rather than including resistive element 1062 in active gate bias driver 1004 as shown in FIG. 10, active gate bias driver 1104, instead includes Zener diode 1263.

Figure 13:
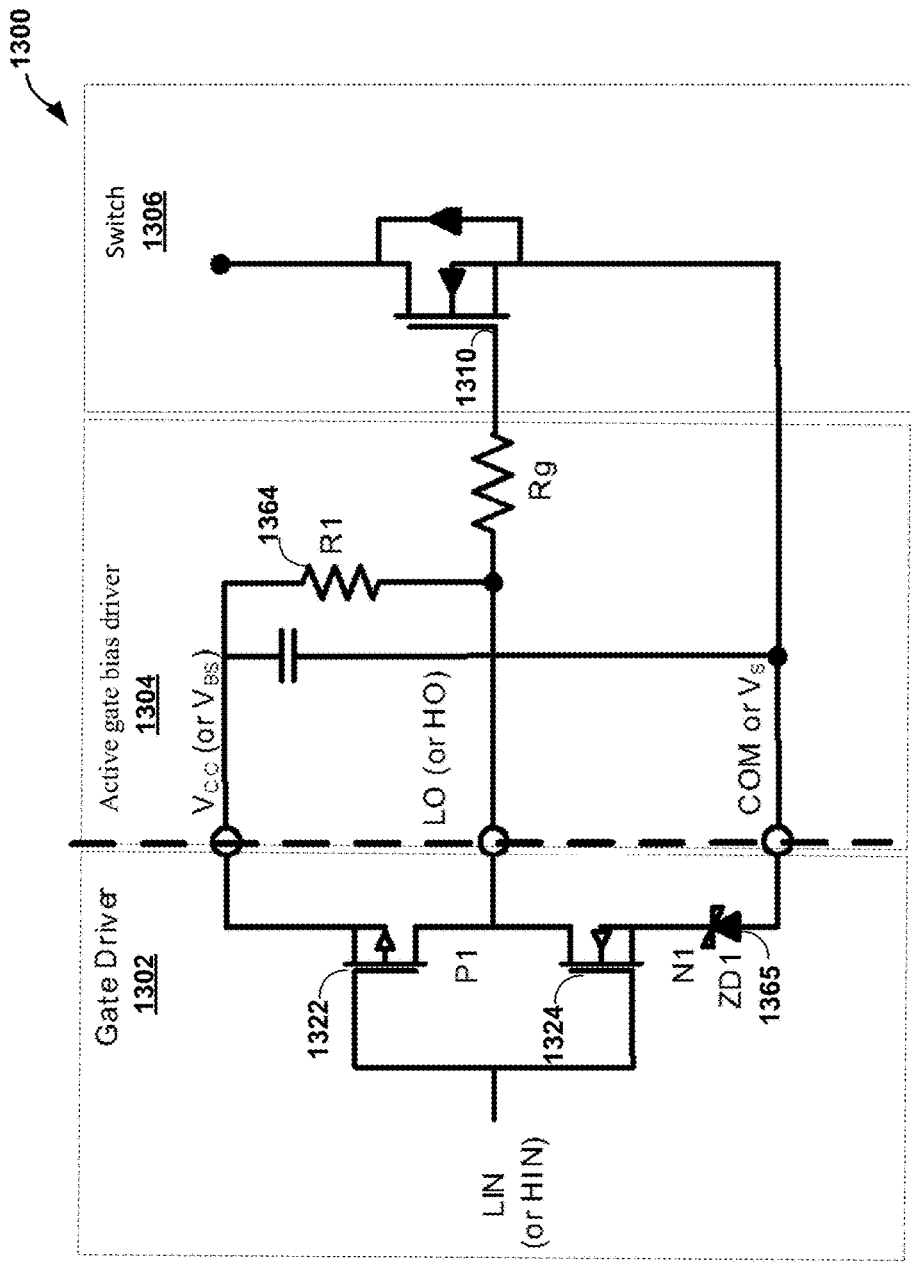
FIG. 13 is a block diagram illustrating a seventh example circuit having active gate bias capability for reducing a reverse recovery charge in a switch, in accordance with one or more aspects of the present disclosure.

FIG. 13 is a block diagram illustrating a seventh example circuit 1300 having active gate bias capability for reducing a reverse recovery charge in a switch, in accordance with one or more aspects of the present disclosure. FIG. 13 shows gate driver 1302, active gate bias driver 1304, and switch 1306. Gate driver 1302 may be an example of gate driver 102 of FIG. 1 and/or an example of gate driver 302 of FIG. 3. For example, switching elements 1322 and 1324 may be examples of switching elements 322 and 324, respectively, of FIG. 3. Active gate bias driver 1304 may be an example of active gate bias driver 104 of FIG. 1. Switch 1306 may be an example of switch 106 of FIG. 1. For instance, switch 1306 may include gate 1310, which may be an example of gate 110 of FIG. 1. FIG. 13 is described in the context of FIGS. 1-12 for exemplary purposes only.

Active gate bias driver 1304 may be similar to active gate bias driver 1004 of FIG. 10. For instance, active gate bias driver 1304 may include resistive element 1364, which may be substantially similar to resistive element 1064 of FIG. 10. However, rather than including resistive element 1062 in active gate bias driver 1004 as shown in FIG. 10, active gate bias driver 1104, instead includes Zener diode 1365.

Figure 14:
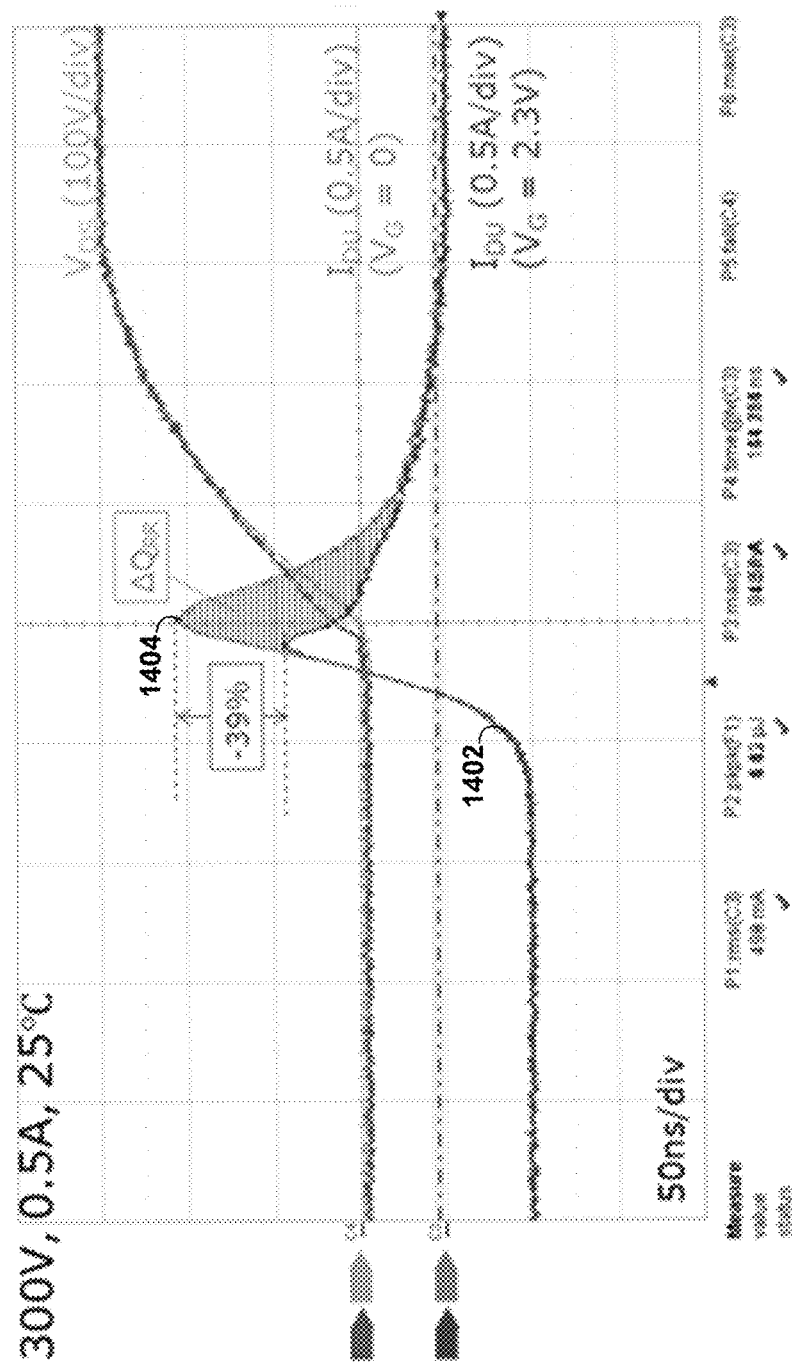
FIG. 14 is a diagram illustrating a performance of an example system having active gate bias capability for reducing a reverse recovery charge in a switch, in accordance with one or more aspects of the present disclosure.

FIG. 14 is a diagram illustrating a performance of an example system having active gate bias capability for reducing a reverse recovery charge in a switch, in accordance with one or more aspects of the present disclosure. In the example of FIG. 14, an inverter may operate at bus voltage $V_{BUS}$=300 V, motor phase current $I_{motor}$=500 $m_{Arms}$. As shown, systems using one or more techniques described herein for reducing a reverse recovery charge in a switch may result in current 1402 instead of current 1404. In the example of FIG. 14, a difference of currents 1402 and 1404 results in a 39 percent reduction in a charge level of the switch, thereby reducing a power consumption of the switch and a resulting converter compared with systems that omit the one or more techniques described herein for reducing a reverse recovery charge.

Figure 15:
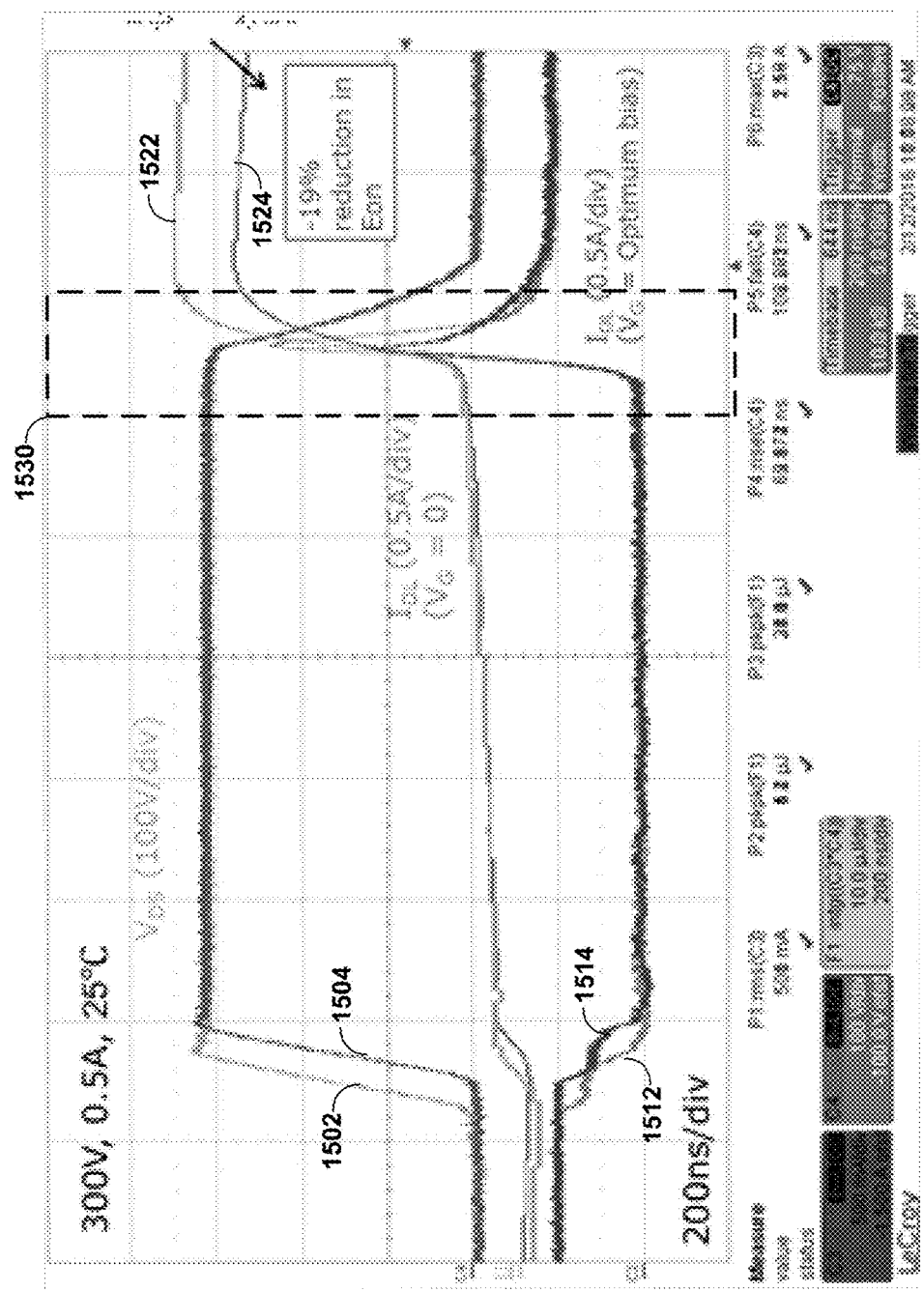
FIG. 15 is a diagram illustrating a switching energy loss, in accordance with one or more aspects of the present disclosure.

FIG. 15 is a diagram illustrating a switching energy loss ($E_{on}$), in accordance with one or more aspects of the present disclosure. In the example of FIG. 15, a system using one or more techniques described herein for reducing a reverse recovery charge in a high voltage switch results in voltage 1504, current 1514, and switching energy loss ($E_{on}$) 1524. Additionally, as shown, a system omitting the one or more techniques described herein for reducing the reverse recovery charge in the high voltage switch results in voltage 1502, current 1512, and switching energy loss ($E_{on}$) 1522. In this example, voltages 1502 and 1504 are similar but currents 1512 and 1514 are different. More specifically, current 1514 is substantially less than current 1512 during time span 1530. As such, the system using one or more techniques described herein for reducing the reverse recovery charge in the high voltage switch may result in switching energy loss ($E_{on}$) 1524, which is about a 19% reduction from switching energy loss ($E_{on}$) 1522 for the system omitting the one or more techniques described herein for reducing the reverse recovery charge in the high voltage switch.

Figure 16:
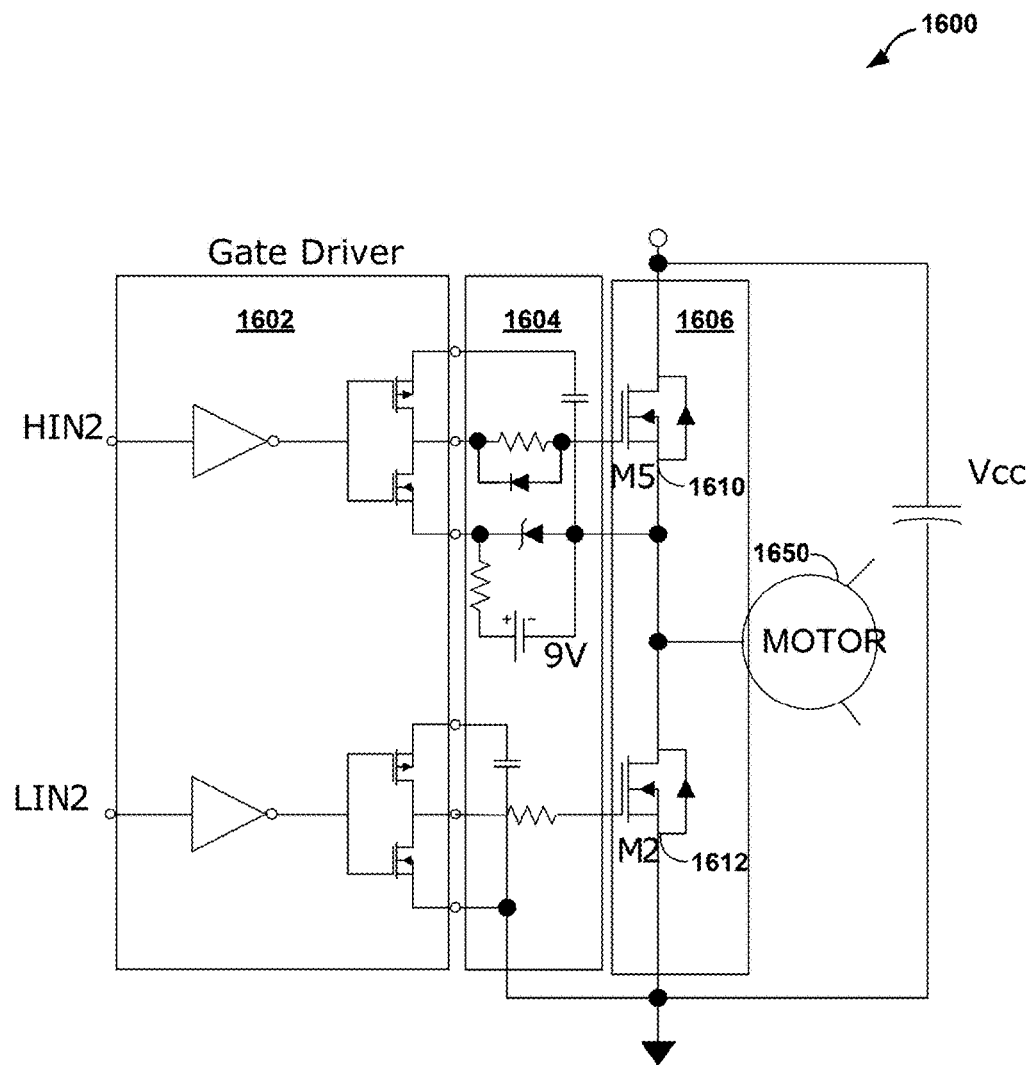
FIG. 16 is an exemplary circuit for a motor application, in accordance with one or more aspects of the present disclosure.

FIG. 16 is an exemplary circuit 1600 for a motor application, in accordance with one or more aspects of the present disclosure. FIG. 16 shows gate driver 1602, active gate bias driver 1604, switch 1606, and motor 1650. Gate driver 1602 may be an example of gate driver 1002 of FIG. 10 and/or gate driver 302 of FIG. 3. Active gate bias driver 1604 may be an example of active gate bias driver 1004 of FIG. 10. Switch 1606 may be an example of switch 1006 of FIG. 10. As shown, switch 1606 may include M5 1610 and M2 1612. FIG. 16 is described in the context of FIGS. 1-10 for exemplary purposes only.

In the example of FIG. 16, active gate bias driver 1604 may apply a gate biasing mechanism to only M5 1610 of six FETs for the motor application. Active gate bias driver 1604 may apply the gate bias after the 0 logic is applied to a channel. Said differently, active gate bias driver 1604 may only bias M5 1610, the high side FREDFET on phase V. Active gate bias driver 1604 applies an optimal gate bias when an HIN2 signal is LO, which is when M5 1610 may undergo a commutation and reduce an accumulation of a minority charge. Active gate bias driver 1604 may apply the gate bias to affect the complimentary device M2 1612 primarily to obtain a lower loss in M2 1612 with the gate bias.

Figure 17:
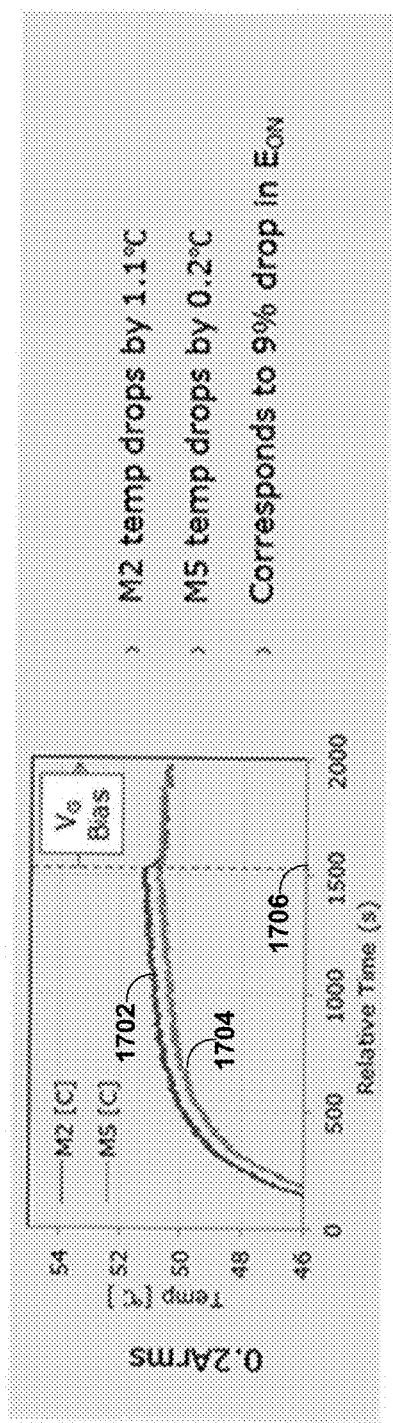
FIG. 17 is a diagram illustrating a first thermal performance of the exemplary circuit of FIG. 16, in accordance with one or more aspects of the present disclosure.

FIG. 17 is a diagram illustrating a first thermal performance of exemplary circuit 1600 of FIG. 16, in accordance with one or more aspects of the present disclosure. FIG. 17 illustrates temperatures 1702 and 1704 for a light load condition of 0.2 Arms. More specifically, FIG. 17 illustrates temperature 1702 for M2 1612 as a function of time during the light load condition and temperature 1704 for M5 1610 as a function of time during the light load condition. In the example of FIG. 17, motor 1650 is initially run under reference conditions without applying active bias techniques described herein. In this example, when temperature 1702 of M2 1612 reaches steady state, active gate bias driver 1604 outputs a gate bias on M5 1610. As shown, temperatures 1702 and 1704 are rising with the switches under reference condition. At time 1706, M2 1612 reaches steady state and active gate bias driver 1604 outputs the gate bias on the high side M5 1610. As shown, temperature 1702 at the low side switch (e.g., M2 1612) drops 1.1 degrees Celsius (° C.) after time 1706, which may correspond to a reduction of 9% in switching energy loss ($E_{on}$). It should be understood that, in the example of FIG. 17, active gate bias driver 1604 applies the gate bias to one switch only. However active gate bias driver 1604 may apply the active bias to all 6 switches, which may result in a bigger drop in temperature (e.g., more than 5 degrees Celsius (° C.) due to mutual heating).

Figure 18:
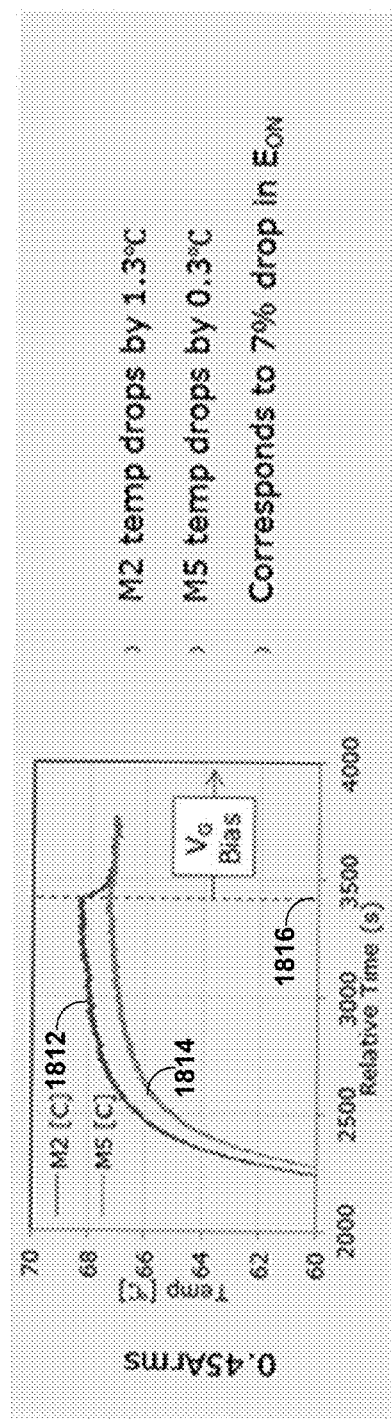
FIG. 18 is a diagram illustrating a second thermal performance of the exemplary circuit of FIG. 16, in accordance with one or more aspects of the present disclosure.

FIG. 18 is a diagram illustrating a second thermal performance of exemplary circuit 1600 of FIG. 16, in accordance with one or more aspects of the present disclosure. FIG. 18 illustrates temperatures 1812 and 1814 for a full load condition 0.45 Arms. More specifically, FIG. 18 illustrates temperature 1812 for M2 1612 as a function of time during the heavy load condition and temperature 1814 for M5 1610 as a function of time during the heavy load condition. In the example of FIG. 18, motor 1650 is initially run under reference conditions without applying active bias techniques described herein. In this example, when the temperature of M2 1612 reaches steady state, active gate bias driver 1604 outputs a gate bias on M5 1610. As shown, temperature 1812 at the low side switch (e.g., M2 1612) drops 1.3 degrees Celsius (° C.) after time 1816, which may correspond to a reduction of 7% in switching energy loss ($E_{on}$). It should be understood that, in the example of FIG. 18, active gate bias driver 1604 applies the gate bias to one switch only. However active gate bias driver 1604 may apply the active bias to all 6 switches, which may result in a bigger drop in temperature (e.g., more than 5 degrees Celsius (° C.) due to mutual heating).

The following "examples" demonstrate some specific aspects of devices and techniques according to this disclosure.

Example 1

A device comprising: a gate driver configured to output, to a gate of a switch, a turn-on voltage for activating the switch in response to receiving an indication to activate the switch; and an active gate bias driver configured to actively drive a voltage at the gate of the switch to a bias voltage in response to receiving an indication to deactivate the switch, wherein the bias voltage is less than the turn-on voltage and wherein the bias voltage is greater than a ground voltage of the gate driver.

Example 2

The device of example 1, wherein the active gate bias driver is further configured to receive a reference voltage signal and wherein the active gate bias driver is further configured to actively drive the voltage at the gate of the switch to the bias voltage according to the reference voltage signal.

Example 3

The device of any of examples 1-2 or a combination thereof, wherein the reference voltage signal is generated by a reference voltage source having a temperature coefficient corresponding to a temperature coefficient of the switch.

Example 4

The device of any of examples 1-3 or a combination thereof, wherein the active gate bias driver is further configured to receive an indication of a gate voltage at the gate of the switch and wherein the active gate bias driver is further configured to actively drive the voltage at the gate of the switch to the bias voltage according to the indication of the gate voltage.

Example 5

The device of any of examples 1-4 or a combination thereof, wherein the active gate bias driver is further configured to receive an indication of a current flowing through the switch and wherein the active gate bias driver is further configured to actively drive the voltage at the gate of the switch to the bias voltage according to the indication of the current flowing through the switch.

Example 6

The device of any of examples 1-5 or a combination thereof, further comprising a buffer module configured to: cause the active gate bias driver to initially output, to the gate of the switch, a buffered voltage when actively driving the voltage at the gate of the switch to the bias voltage; and modify the buffered voltage to correspond to a detected voltage at the gate, the detected voltage being detected after initially outputting the buffered voltage and prior to activating the switch.

Example 7

The device of any of examples 1-6, or a combination thereof, wherein the active gate bias driver is further configured to actively drive the gate of the switch to the bias voltage during a dead time of the switch, during a body diode conduction of the switch, or a combination thereof.

Example 8

The device of any of examples 1-7 or a combination thereof, wherein the bias voltage is a first bias voltage and wherein the active gate bias driver is further configured to: actively drive the voltage at the gate of the switch to the first bias voltage during a first dead time of the switch, the first dead time being before the switch is deactivated; and actively drive the voltage at the gate of the switch to a second bias voltage during a second dead time of the switch, the second dead time being before the switch is activated, wherein the second bias voltage is different from the first bias voltage.

Example 9

The device of any of examples 1-8 or a combination thereof, wherein the active gate bias driver is a high voltage gate driver and the switch is a high voltage switch.

Example 10

A method comprising: outputting, to a gate of a switch, a turn-on voltage for activating the switch in response to receiving an indication to activate the switch; and actively driving a voltage at the gate of the switch to a bias voltage in response to receiving an indication to deactivate the switch, wherein the bias voltage is less than the turn-on voltage and wherein the bias voltage is greater than a ground voltage of the switch.

Example 11

The method of example 10, further comprising: receiving a reference voltage signal; and actively driving the voltage at the gate of the switch to the bias voltage according to the reference voltage signal.

Example 12

The method of examples 10-11 or a combination thereof, wherein the reference voltage signal is generated by a reference voltage source having a temperature coefficient corresponding to a temperature coefficient of the switch.

Example 13

The method of examples 10-12 or a combination thereof, further comprising: receiving an indication of the gate voltage at the gate of the switch; and actively driving the voltage at the gate of the switch to the bias voltage according to the indication of the gate voltage.

Example 14

The method of examples 10-13 or a combination thereof, further comprising: receiving an indication of a current flowing through the switch; and actively driving the voltage at the gate of the switch to the bias voltage according to the indication of the current flowing through the switch.

Example 15

The method of examples 10-14 or a combination thereof, further comprising: actively driving a voltage at the gate of the switch to the bias voltage by initially outputting, to the gate of the switch, a buffered voltage; modifying the buffered voltage to correspond to a detected voltage at the gate, the detected voltage being detected after initially outputting the buffered voltage and prior to activating the switch.

Example 16

The method of examples 10-15 or a combination thereof, further comprising: actively driving the gate of the switch to the bias voltage during a dead time of the switch, during a body diode conduction of the switch, or a combination thereof.

Example 17

The method of examples 10-16 or a combination thereof, wherein the bias voltage is a first bias voltage, the method further comprising: actively driving the voltage at the gate of the switch to the first bias voltage during a first dead time of the switch, the first dead time being before the switch is deactivated; and actively driving the voltage at the gate of the switch to a second bias voltage during a second dead time of the switch, the second dead time being before the switch is activated, wherein the second bias voltage is different from the first bias voltage.

Example 18

A system comprising: a gate driver configured to: generate a first control signal in response to receiving an indication to activate a switch, the first control signal being configured to activate a first switching element such that the gate drive module outputs, to a gate of the switch, a turn-on voltage for activating the switch; and generate a second control signal in response to receiving an indication to deactivate the switch, the second control signal being configured to deactivate a second switching element such that the gate drive module outputs, to the gate of the switch, a ground voltage for deactivating the switch; and an active gate bias driver comprising: a timing control module configured to output an indication to provide an active gate bias voltage for deactivating the switch based on the first and second control signals; and an active gate bias module configured to actively drive a voltage at the gate of the switch to a bias voltage in response to receiving the indication to provide the active gate bias voltage for deactivating the switch, wherein the bias voltage is less than the turn-on voltage and wherein the bias voltage is greater than the ground voltage for deactivating the switch.

Example 19

The system of example 18, further comprising: the switch; and a resistive element configured to output an indication of a current flowing through the switch, wherein the active gate bias driver is further configured to actively drive the voltage at the gate of the switch to the bias voltage according to the indication of the current flowing through the switch.

Example 20

The system of examples 18-19 or a combination thereof, further comprising a buffer module configured to: cause the active gate bias driver to initially output, to the gate of the switch, a buffered voltage when actively driving the voltage at the gate of the switch to the bias voltage; and modify the buffered voltage to correspond to a detected voltage at the gate, the detected voltage being detected after initially outputting the buffered voltage and prior to activating the switch.

In one or more examples, the driver functions being performed described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this way, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples have been described. These and other examples are within the scope of the following claims.

What is claimed is:

1. A device comprising:
a gate driver configured to receive a reference voltage signal and output, to a gate of a switch, a turn-on voltage for activating the switch in response to receiving an indication to activate the switch, wherein the reference voltage signal is generated by a reference voltage source having a temperature coefficient corresponding to a temperature coefficient of the switch; and
an active gate bias driver configured to actively drive a voltage at the gate of the switch to a bias voltage according to the reference voltage signal in response to receiving an indication to deactivate the switch, wherein the bias voltage is less than the turn-on voltage and wherein the bias voltage is greater than a ground voltage of the gate driver.

2. The device of claim 1, wherein the active gate bias driver is further configured to receive an indication of a gate voltage at the gate of the switch and wherein the active gate bias driver is further configured to actively drive the voltage at the gate of the switch to the bias voltage according to the indication of the gate voltage.

3. The device of claim 1, wherein the active gate bias driver is further configured to receive an indication of a current flowing through the switch and wherein the active gate bias driver is further configured to actively drive the voltage at the gate of the switch to the bias voltage according to the indication of the current flowing through the switch.

4. The device of claim 1, further comprising a buffer module configured to:
cause the active gate bias driver to initially output, to the gate of the switch, a buffered voltage when actively driving the voltage at the gate of the switch to the bias voltage; and
modify the buffered voltage to correspond to a detected voltage at the gate, the detected voltage being detected after initially outputting the buffered voltage and prior to activating the switch.

5. The device of claim 1, wherein the active gate bias driver is further configured to actively drive the gate of the switch to the bias voltage during a dead time of the switch, during a body diode conduction of the switch, or a combination thereof.

6. The device of claim 1, wherein the active gate bias driver is a high voltage gate driver and the switch is a high voltage switch.

7. A device comprising:
a gate driver configured to output, to a gate of a switch, a turn-on voltage for activating the switch in response to receiving an indication to activate the switch; and
an active gate bias driver configured to actively drive a voltage at the gate of the switch to a first bias voltage in response to receiving an indication to deactivate the switch,
wherein the first bias voltage is less than the turn-on voltage and wherein the first bias voltage is greater than a ground voltage of the gate driver, and
wherein the active gate bias driver is further configured to:
actively drive the voltage at the gate of the switch to the first bias voltage during a first dead time of the switch, the first dead time being before the switch is deactivated; and
actively drive the voltage at the gate of the switch to a second bias voltage during a second dead time of the switch, the second dead time being before the switch is activated,
wherein the second bias voltage is different from the first bias voltage.

8. A method comprising:
receiving a reference voltage signal;
outputting, to a gate of a switch, a turn-on voltage for activating the switch in response to receiving an indication to activate the switch, wherein the reference voltage signal is generated by a reference voltage source having a temperature coefficient corresponding to a temperature coefficient of the switch; and
actively driving a voltage at the gate of the switch to a bias voltage according to the reference voltage signal in response to receiving an indication to deactivate the switch, wherein the bias voltage is less than the turn-on voltage and wherein the bias voltage is greater than a ground voltage of the switch.

9. The method of claim 8, further comprising:
receiving an indication of the gate voltage at the gate of the switch; and
actively driving the voltage at the gate of the switch to the bias voltage according to the indication of the gate voltage.

10. The method of claim 8, further comprising:
receiving an indication of a current flowing through the switch; and
actively driving the voltage at the gate of the switch to the bias voltage according to the indication of the current flowing through the switch.

11. The method of claim 8, further comprising:
actively driving a voltage at the gate of the switch to the bias voltage by initially outputting, to the gate of the switch, a buffered voltage;
modifying the buffered voltage to correspond to a detected voltage at the gate, the detected voltage being detected after initially outputting the buffered voltage and prior to activating the switch.

12. The method of claim 8, further comprising:
actively driving the gate of the switch to the bias voltage during a dead time of the switch, during a body diode conduction of the switch, or a combination thereof.

13. A method comprising:
outputting, to a gate of a switch, a turn-on voltage for activating the switch in response to receiving an indication to activate the switch; and
actively driving a voltage at the gate of the switch to a first bias voltage in response to receiving an indication to deactivate the switch, wherein the first bias voltage is less than the turn-on voltage and wherein the first bias voltage is greater than a ground voltage of the switch,
actively driving the voltage at the gate of the switch to the first bias voltage during a first dead time of the switch, the first dead time being before the switch is deactivated; and
actively driving the voltage at the gate of the switch to a second bias voltage during a second dead time of the switch, the second dead time being before the switch is activated, wherein the second bias voltage is different from the first bias voltage.

14. A system comprising:
a gate driver configured to:
generate a first control signal in response to receiving an indication to activate a switch, the first control signal being configured to activate a first switching element such that the gate drive module outputs, to a gate of the switch, a turn-on voltage for activating the switch; and
generate a second control signal in response to receiving an indication to deactivate the switch, the second control signal being configured to deactivate a second switching element such that the gate drive module outputs, to the gate of the switch, a ground voltage for deactivating the switch; and
an active gate bias driver comprising:
a timing control module configured to output an indication to provide an active gate bias voltage for deactivating the switch based on the first and second control signals; and
an active gate bias module configured to actively drive a voltage at the gate of the switch to a bias voltage in response to receiving the indication to provide the active gate bias voltage for deactivating the switch,
wherein the bias voltage is less than the turn-on voltage and wherein the bias voltage is greater than the ground voltage for deactivating the switch.

15. The system of claim 14, further comprising:
the switch; and
a resistive element configured to output an indication of a current flowing through the switch,
wherein the active gate bias driver is further configured to actively drive the voltage at the gate of the switch to the bias voltage according to the indication of the current flowing through the switch.

16. The system of claim 14, further comprising a buffer module configured to:
- cause the active gate bias driver to initially output, to the gate of the switch, a buffered voltage when actively driving the voltage at the gate of the switch to the bias voltage; and
- modify the buffered voltage to correspond to a detected voltage at the gate, the detected voltage being detected after initially outputting the buffered voltage and prior to activating the switch.

* * * * *